(12) United States Patent
Rathburn

(10) Patent No.: US 9,320,133 B2
(45) Date of Patent: Apr. 19, 2016

(54) ELECTRICAL INTERCONNECT IC DEVICE SOCKET

(75) Inventor: James Rathburn, Maple Grove, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 255 days.

(21) Appl. No.: 13/880,461

(22) PCT Filed: Dec. 5, 2011

(86) PCT No.: PCT/US2011/063247
§ 371 (c)(1),
(2), (4) Date: Apr. 19, 2013

(87) PCT Pub. No.: WO2012/078493
PCT Pub. Date: Jun. 14, 2012

(65) Prior Publication Data
US 2013/0206468 A1    Aug. 15, 2013

Related U.S. Application Data

(63) Continuation-in-part of application No. 13/320,285, filed as application No. PCT/US2010/036282 on May 27, 2010, application No. 13/880,461, which is a continuation-in-part of application No. 13/575,368,
(Continued)

(51) Int. Cl.
*H05K 1/02*        (2006.01)
*H01R 43/02*       (2006.01)
(Continued)

(52) U.S. Cl.
CPC .......... *H05K 1/0228* (2013.01); *H01R 43/0256* (2013.01); *H05K 1/0296* (2013.01);
(Continued)

(58) Field of Classification Search
CPC . H01R 43/0256; H05K 1/141; H05K 3/3436; H05K 3/3484; H05K 3/4046
USPC ......................................................... 174/263
See application file for complete search history.

(56) References Cited

U.S. PATENT DOCUMENTS 3,672,986 A    6/1972  Schneble, Jr. et al.
4,188,438 A    2/1980  Burns
(Continued)

FOREIGN PATENT DOCUMENTS

JP    2003/217774    7/2003
WO    WO 91/14015    9/1991
(Continued)

OTHER PUBLICATIONS

Notification of Transmittal of the International Search Report and the Written Opinion of the International Searching Authority mailed Oct. 27, 2014 in International Application No. PCT/US2014/045856.
(Continued)

*Primary Examiner* — Jenny L Wagner
*Assistant Examiner* — Jessey R Ervin

(57) ABSTRACT

A surface mount electrical interconnect is disclosed that provides an interface between a PCB and solder balls of a BGA device. The electrical interconnect includes a socket substrate and a plurality of electrically conductive contact members. The socket substrate has a first layer with a plurality of openings configured to receive solder balls of the BGA device and has a second layer with a plurality of slots defined therethrough that correspond to the plurality of openings. The contact members may be disposed in the openings in the first layer and through the plurality of slots of the second layer of the socket substrate. The contact members can be configured to engage a top portion, a center diameter, and a lower portion of the solder ball of the BGA device. Each contact member electrically couples a solder ball on the BGA device to the PCB.

20 Claims, 25 Drawing Sheets

Related U.S. Application Data filed as application No. PCT/US2011/023138 on Jan. 31, 2011, now abandoned, application No. 13/880,461, which is a continuation-in-part of application No. 13/643,436, filed as application No. PCT/US2011/033726 on Apr. 25, 2011, now Pat. No. 9,184,145, application No. 13/880,461, which is a continuation-in-part of application No. 13/410,914, filed on Mar. 2, 2012.

(60) Provisional application No. 61/420,043, filed on Dec. 6, 2010, provisional application No. 61/183,340, filed on Jun. 2, 2009, provisional application No. 61/300,628, filed on Feb. 2, 2010, provisional application No. 61/327,795, filed on Apr. 26, 2010, provisional application No. 61/448,288, filed on Mar. 2, 2011.

(51) Int. Cl.
  *H05K 3/40* (2006.01)
  *H05K 1/14* (2006.01)
  *H05K 3/34* (2006.01)

(52) U.S. Cl.
  CPC .............. *H05K 3/40* (2013.01); *H05K 3/4046* (2013.01); *H05K 1/141* (2013.01); *H05K 3/3436* (2013.01); *H05K 3/3484* (2013.01); *H05K 2201/10378* (2013.01); *H05K 2203/041* (2013.01); *Y10T 29/49147* (2015.01)

(56) References Cited

U.S. PATENT DOCUMENTS

| | | |
|---|---|---|
| 4,295,700 A | 10/1981 | Sado |
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,071,363 A | 12/1991 | Reylek et al. |
| 5,072,520 A | 12/1991 | Nelson |
| 5,096,426 A | 3/1992 | Simpson et al. |
| 5,127,837 A | 7/1992 | Shah et al. |
| 5,129,573 A | 7/1992 | Duffey |
| 5,161,983 A | 11/1992 | Ohno |
| 5,167,512 A | 12/1992 | Walkup |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther |
| 5,509,019 A | 4/1996 | Yamamura |
| 5,527,998 A | 6/1996 | Anderson et al. |
| 5,562,462 A | 10/1996 | Matsuba et al. |
| 5,619,018 A * | 4/1997 | Rossi ............... H05K 3/308 174/261 |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozier et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,494,725 B2 | 12/2002 | Lin et al. |
| 6,506,438 B2 | 1/2003 | Duthaler et al. |
| 6,521,489 B2 | 2/2003 | Duthaler |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhaus et al. |
| 6,856,151 B1 | 2/2005 | Cram |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |

(56) References Cited

U.S. PATENT DOCUMENTS

| | | |
|---|---|---|
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,064,412 B2 | 6/2006 | Geissinger et al. |
| 7,070,419 B2 | 7/2006 | Brown et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,536,714 B2 | 5/2009 | Yuan |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,955,088 B2 | 6/2011 | Di Stefano |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakaguchi |
| 8,536,889 B2 | 9/2013 | Nelson et al. |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 2001/0012707 A1 | 8/2001 | Ho et al. |
| 2001/0016551 A1 | 8/2001 | Yushio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsunami |
| 2005/0100294 A1 | 5/2005 | Nguyen et al. |
| 2005/0101164 A1 | 5/2005 | Rathburn |
| 2005/0162176 A1 | 7/2005 | Bucksch |

(56) References Cited

U.S. PATENT DOCUMENTS

| | | |
|---|---|---|
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Anderson |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0281303 A1 | 12/2006 | Trezza et al. |
| 2007/0021002 A1 | 1/2007 | Laurx et al. |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0156856 A1 | 7/2008 | Laurx |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0013901 A1 | 1/2015 | Rathburn |
| 2015/0091600 A1 | 4/2015 | Rathburn |
| 2015/0136467 A1 | 5/2015 | Rathburn |
| 2015/0162678 A1 | 6/2015 | Rathburn |
| 2015/0181710 A1 | 6/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |

(56) References Cited

FOREIGN PATENT DOCUMENTS

| WO | WO 2012/125331 | 9/2012 |
|---|---|---|
| WO | WO 2013/036565 | 3/2013 |
| WO | WO-2014/011226 | 1/2014 |
| WO | WO-2014/011228 | 1/2014 |
| WO | WO-2014/011232 | 1/2014 |
| WO | WO-2015/006393 | 1/2015 |

OTHER PUBLICATIONS

*Ex Parte Quayle* Action mailed Oct. 1, 2014 in co-pending U.S. Appl. No. 13/266,486, now published as US Patent Application Publication No. US 2012/0055701.
Amendment and Response After *ExParte Quayle* Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.

(56) References Cited

OTHER PUBLICATIONS

Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Final Office Action mailed Mar. 16, 2015 in co-pending U.S. Appl. No. 13/320,285, now published as US Patent Application Publication No. US 2012/0055702.
Final Office Action mailed Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 13/319,158, now published as US Patent Application Publication No. 2012/0051016.
Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action mailed Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.
Co-pending U.S. Appl. No. 13/575,368, titled High Speed Backplane Connector, filed Jul. 26, 2012.
Co-pending U.S. Appl. No. 13/643,436 titled Semiconductor Device Package Adapter, filed Oct. 25, 2012.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Supplemental Notice of Allowance mailed Dec. 19, 2014 in co-pending U.S. Appl. No. 13/318,181, now published as US Patent Application Publication No. US 2012/0044659.
Office Action mailed Nov. 19, 2014 in co-pending U.S. Appl. No. 13/318,200, now published as US Patent Application Publication No. US 2012/0056332.
Office Action mailed Nov. 14, 2014 in co-pending U.S. Appl. No. 13/318,369, now published as US Patent Application Publication No. US 2012/0043119.
Amendment and Response and Terminal Disclaimer filed Nov. 14, 2014 in co-pending U.S. Appl. No. 13/318,382, now published as US Patent Application Publication No. US 2012/0043130.
Notice of Allowance and Fee(s) Due mailed Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Amendment and Response filed Nov. 19, 2014 in co-pending U.S. Appl. No. 13/643,436, now published as US Patent Application Publication No. 2013/0105984.
Response Under Rule 1.116 filed Nov. 11, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Office Action mailed Nov. 17, 2014 in co-pending U.S. Appl. No. 13/879,883, now published as US Patent Application Publication No. 2013/0244490.

(56) References Cited

OTHER PUBLICATIONS

Office Action mailed Dec. 26, 2014 in co-pending U.S. Appl. No. 13/410,914, now published as US Patent Application Publication No. US 2012/0164888.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Notification of Transmittal of the International Search Report and the Written Opinion of the International Searching Authority mailed Jul. 30, 2010 in International Application No. PCT/US2010/036043.
Notification of Transmittal of the International Search Report and the Written Opinion of the International Searching Authority mailed Jul. 21, 2010 in International Application No. PCT/US2010/036047.
Notification of Transmittal of the International Search Report and the Written Opinion of the International Searching Authority mailed Jul. 28, 2010 in International Application No. PCT/US2010/036363.
Notification of Transmittal of the International Search Report and the Written Opinion of the International Searching Authority mailed Jul. 28, 2010 in International Application No. PCT/US2010/036377.
Notification of Transmittal of the International Search Report and the Written Opinion of the International Searching Authority mailed Jul. 30, 2010 in International Application No. PCT/US2010/036388.
Notification of Transmittal of the International Search Report and the Written Opinion of the International Searching Authority mailed Jul. 27, 2010 in International Application No. PCT/US2010/036397.
Notification of Transmittal of the International Search Report and the Written Opinion of the International Searching Authority mailed Jul. 30, 2010 in International Application No. PCT/US2010/036055.
Notification of Transmittal of the International Search Report and the Written Opinion of the International Searching Authority mailed Aug. 4, 2010 in International Application No. PCT/US2010/036288.
Notification of Transmittal of the International Search Report and the Written Opinion of the International Searching Authority mailed Aug. 4, 2010 in International Application No. PCT/US2010/036285.
Notification of Transmittal of the International Search Report and the Written Opinion of the International Searching Authority mailed Jul. 30, 2010 in International Application No. PCT/US2010/036282.
Notification of Transmittal of the International Search Report and the Written Opinion of the International Searching Authority mailed Jul. 30, 2010 in International Application No. PCT/US2010/036295.
Notification of Transmittal of the International Search Report and the Written Opinion of the International Searching Authority mailed Jul. 30, 2010 in International Application No. PCT/US2010/036313.
Notification of Transmittal of the International Search Report and the Written Opinion of the International Searching Authority mailed Aug. 3, 2010 in International Application No. PCT/US2010/037619.
Notification of Transmittal of the International Search Report and the Written Opinion of the International Searching Authority mailed Sep. 7, 2010 in International Application No. PCT/US2010/038600.
Notification of Transmittal of the International Search Report and the Written Opinion of the International Searching Authority mailed Aug. 18, 2010 in International Application No. PCT/US2010/038606.
Notification of Transmittal of the International Search Report and the Written Opinion of the International Searching Authority mailed Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority mailed Apr. 14, 2011 in International Application No. PCT/US2011/023138.
Notification of Transmittal of the International Search Report and the Written Opinion of the International Searching Authority mailed Aug. 17, 2011 in International Application No. PCT/US2011/033726.
Notification of Transmittal of the International Search Report and the Written Opinion of the International Searching Authority mailed Sep. 27, 2011 in International Application No. PCT/US2011/038845.
Notification of Transmittal of the International Search Report and the Written Opinion of the International Searching Authority mailed Feb. 8, 2012 in International Application No. PCT/US2011/056664.
Notification of Transmittal of the International Search Report and the Written Opinion of the International Searching Authority mailed Mar. 26, 2012 in International Application No. PCT/US2011/062313.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.

(56) References Cited

OTHER PUBLICATIONS

Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Office Action mailed Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Print—Definition of Print by The Free Dictionary, http//www.thefreedictionary.com/print, Aug. 13, 2014.

Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/319,120, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.

(56) References Cited

OTHER PUBLICATIONS

Co-pending U.S. Appl. No. 14/327,916 titled Matrix Defined Electrical Circuit Structure, filed Jul. 10, 2014.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.

Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.

(56) References Cited

OTHER PUBLICATIONS

Response to Restriction Requirement filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Notice of Allowance and Fee(s) Due mailed Apr. 9, 2015 in co-pending U.S. Appl. No. 13/266,573, now issued as U.S. Pat. No. 9,054,097.
Notice of Allowance and Fee(s) Due mailed Apr. 13, 2015 in co-pending U.S. Appl. No. 13/318,200, now published as US Patent Application Publication No. US 2012/0056332.
Notice of Allowance and Fee(s) Due mailed May 18, 2015 in co-pending U.S. Appl. No. 14/086,029, now issued as U.S. Pat. No. 9,076,884.
Final Office Action mailed Jun. 30, 2015 in co-pending U.S. Appl. No. 13/318,369, now published as US Patent Application Publication No. US 2012/0043119.
Office Action mailed Apr. 23, 2015 in co-pending U.S. Appl. No. 13/319,158, now published as US Patent Application Publication No. 2012/0051016.
Office Action mailed Apr. 2, 2015 in co-pending U.S. Appl. No. 13/700,639, now published as US Patent Application Publication No. 2013/0078860.
Final Office Action mailed Apr. 23, 2015 in co-pending U.S. Appl. No. 13/879,783, now published as US Patent Application Publication No. 2013/0223034.
Notice of Allowance and Fee(s) Due mailed May 28, 2015 in co-pending U.S. Appl. No. 13/879,883, now published as US Patent Application Publication No. 2013/0244490.
Office Action mailed May 22, 2015 in co-pending U.S. Appl. No. 13/880,231, now published as US Patent Application Publication No. 2013/0210276.
Notice of Allowance and Fee(s) Due mailed Jun. 4, 2015 in co-pending U.S. Appl. No. 13/410,914, now published as US Patent Application Publication No. US 2012/0164888.

* cited by examiner

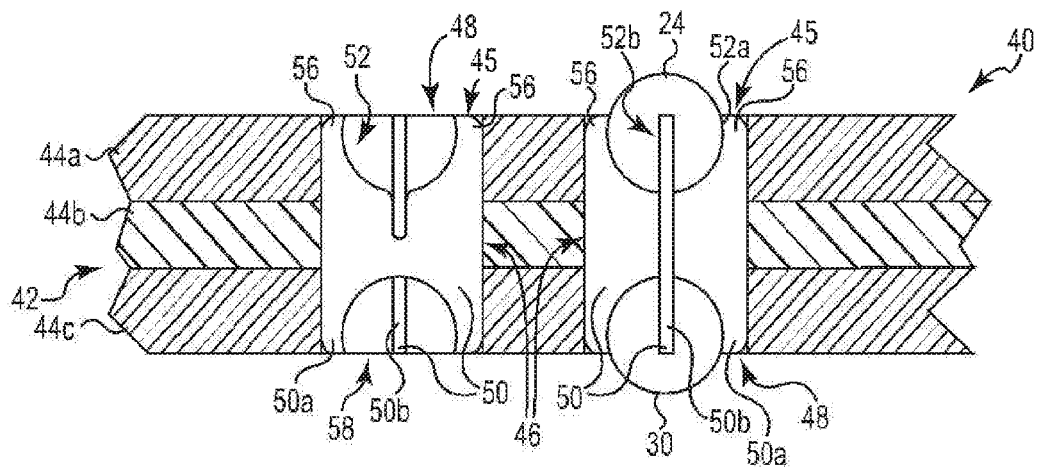
Fig. 2A
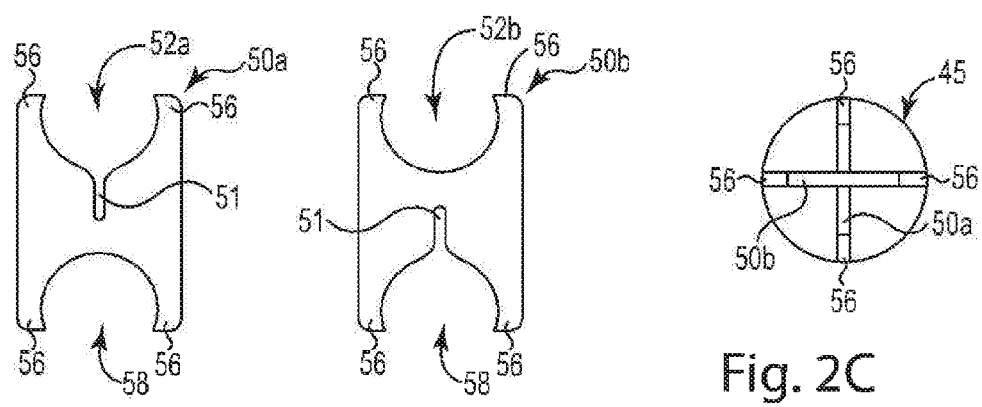
Fig. 2B
Fig. 2C

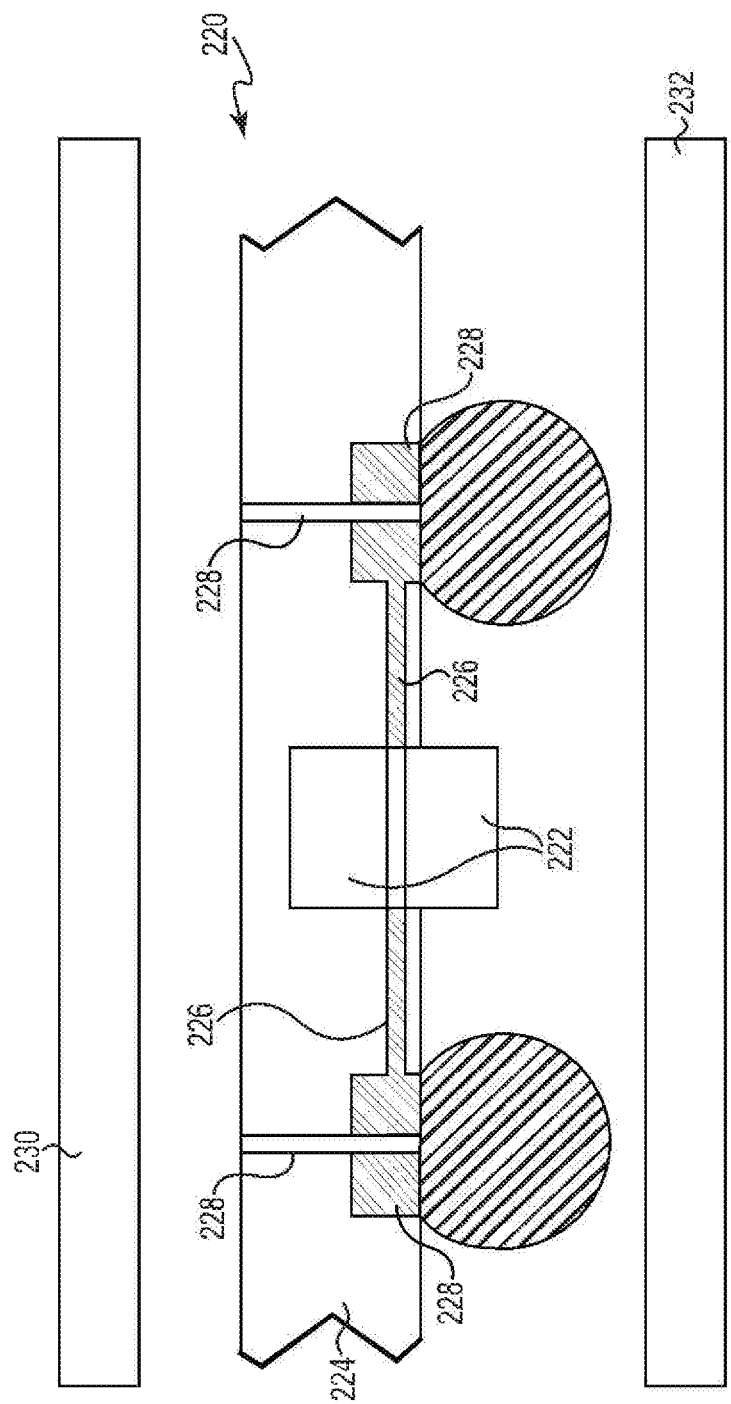

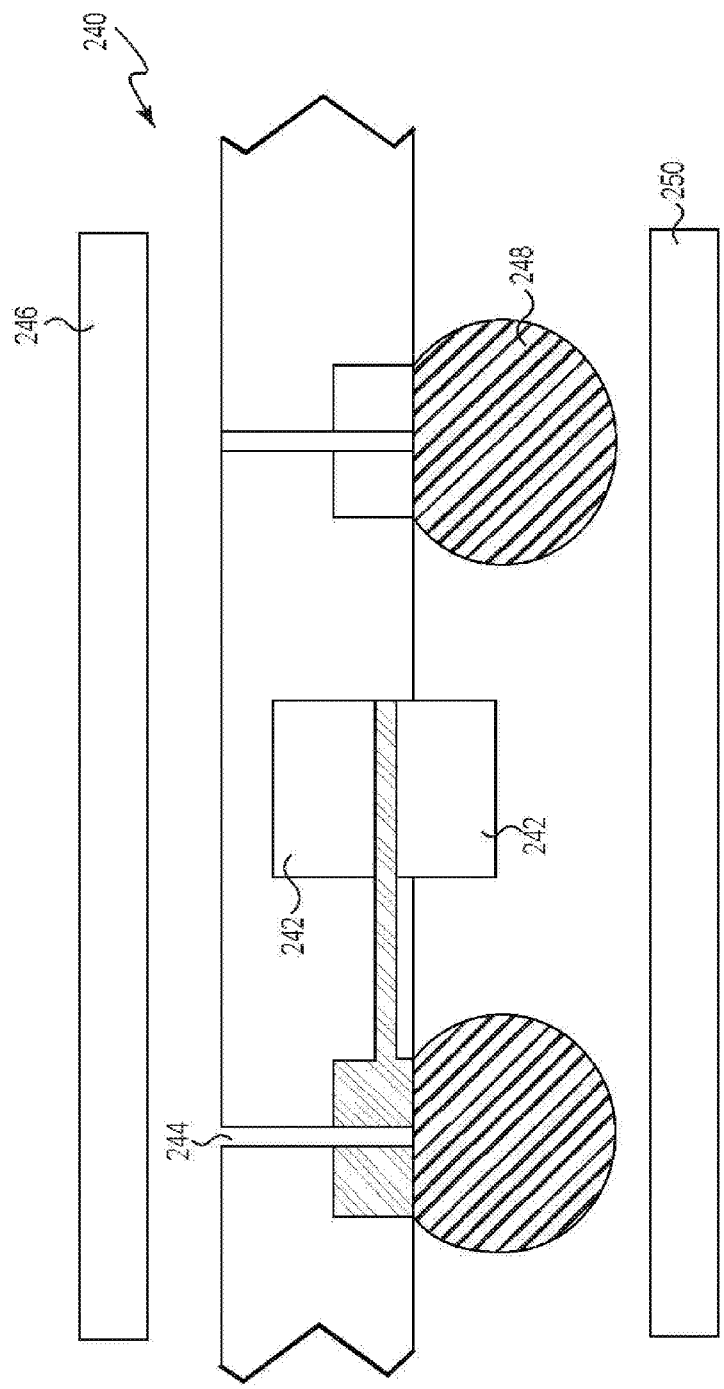

ELECTRICAL INTERCONNECT IC DEVICE SOCKET

CROSS-REFERENCE TO RELATED APPLICATIONS

This application claims the benefit of a national stage application under 35 U.S.C. §371 of International Application No. PCT/US2011/063247, titled ELECTRICAL INTERCONNECT IC DEVICE SOCKET, filed Dec. 5, 2011, which claims priority to U.S. Provisional Application No. 61/420,043 filed Dec. 6, 2010, all of which are hereby incorporated by reference in their entireties.

This application is a continuation-in-part of U.S. patent application Ser. No. 13/320,285, titled COMPLIANT PRINTED FLEXIBLE CIRCUIT, filed Nov. 14, 2011, which is a national stage application under 35 U.S.C. §371 of International Application No. PCT/US2010/036282, titled COMPLIANT PRINTED FLEXIBLE CIRCUIT, filed May 27, 2010, which claims priority to U.S. Provisional Application No. 61/183,340, filed Jun. 2, 2009, all of which are hereby incorporated by reference in their entireties.

This application is a continuation-in-part of U.S. patent application Ser. No. 13/575,368, titled HIGH SPEED BACKPLANE CONNECTOR, filed Jul. 26, 2012, which is a national stage application under 35 U.S.C. §371 of International Application No. PCT/US2011/023138, titled HIGH SPEED BACKPLANE CONNECTOR, filed Jan. 31, 2011, which claims priority to U.S. Provisional Application No. 61/300,628, filed Feb. 2, 2010, all of which are hereby incorporated by reference in their entireties.

This application is a continuation-in-part of U.S. patent application Ser. No. 13/643,436, titled SEMICONDUCTOR DEVICE PACKAGE ADAPTER, filed Dec. 6, 2012, which is a national stage application under 35 U.S.C. §371 of International Application No. PCT/US2011/033726, titled SEMICONDUCTOR DEVICE PACKAGE ADAPTER, filed Apr. 25, 2011, which claims priority to U.S. Provisional Application No. 61/327,795, filed Apr. 26, 2010, all of which are hereby incorporated by reference in their entireties.

This application is a continuation-in-part of U.S. patent application Ser. No. 13/410,914, titled METALIZED PAD TO ELECTRICAL CONTACT INTERFACE, filed Mar. 2, 2012, which claims priority to U.S. Provisional Application No. 61/448,288, filed Mar. 2, 2011, both of which are hereby incorporated by reference in their entireties.

TECHNICAL FIELD

The present disclosure relates to an electrical interconnect integrated circuit ("IC") device socket, and, in particular, to a surface mount ball grid array ("BGA") device socket. The present disclosure also discloses the use of unique fabrication techniques that merge processes used in the printed circuit and semiconductor packaging industries with the flexibility of additive printing technology to make the present surface mount electrical interconnect.

BACKGROUND OF THE INVENTION

Traditional IC sockets are generally constructed of an injection molded plastic insulator housing that includes stamped and formed copper alloy contact members stitched or inserted into recesses. The assembled IC socket is then generally processed through a reflow oven to attach solder balls to the contact members. During final assembly the contact pads on the printed circuit board ("PCB") are printed with solder paste or flux and the solder balls on the IC socket are placed in registration with the contact pads. The assembly is then reflowed and the solder balls essentially weld the IC socket to the PCB.

During use, an IC socket receives an IC device, such as a packaged integrated circuit. The contact members electrically couple the terminals on the IC device with the corresponding terminal on the PCB. The terminals on the IC device are typically held against the contact members by applying a load, which is expected to maintain intimate contact and reliable circuit connection throughout the life of the system without a permanent connection. As a result, the IC device can be removed or replaced without the need for reflowing solder connections.

These types of IC sockets and interconnects have been produced in high volume for many years. As IC devices advance to next generation architectures traditional IC sockets have reached mechanical and electrical limitations that require alternate methods. For example, increased terminal count, reduction in the distance between the contacts known as terminal pitch, and signal integrity have been the main drivers that impact the IC socket design. As terminal counts go up, the IC package essentially gets larger due to the additional space needed for the terminals. As the package grows larger, costs go up and the relative flatness of the package and corresponding PCB require compliance between the contact members in the IC socket and the terminal pad to accommodate the topography differences and maintain reliable connection.

As the terminal pitch is decreased the thickness of the insulating walls in the IC socket housing is also decreased. The length of the contact members is frequently increased to optimize the spring properties. Longer contact members also tend to reduce signal integrity and increase contact resistance due to self-heating of power delivering contacts. The thinner insulating walls increase the difficulty of molding and increase latent stresses in the IC socket housing, increasing the risk of warpage during solder reflow. The thinner insulating walls also increase the risk of cross-talk between adjacent contact members.

Traditional IC sockets have reached an electrical performance limit. Next generation IC devices will operate above 5 GHz and beyond and the existing IC sockets do not provide acceptable performance levels without significant revision.

BRIEF SUMMARY OF THE INVENTION

The present disclosure is directed to a surface mount BGA device socket that will enable next generation electrical performance. The present solution removes the normal retention features, which add parasitic mass and distort or degrade the integrity of the signal as it passes through the contact. This approach provides a reliable connection to BGA devices and creates a platform to add electrical and mechanical enhancements to the socket substrate or assembly to address the challenges of next generation interconnect requirements.

In general terms, the contact members are inserted into openings in the socket substrate. The contact members are configured to receive and retain, the solder balls of the BOA device. No contact retention features are required, greatly reducing the complexity of the component and the tooling required to produce them. Furthermore, reflow of the solder is not necessary for the contact members to retain the solder balls. The contact members also allow the solder balls to be removed without reflow of the solder.

The present disclosure also merges the long-term performance advantages of traditional PCB and semiconductor packaging with the flexibility of additive printing technology. By combining methods used in the PCB fabrication and semiconductor packaging industries, the present disclosure enables fine line high density circuit structures with attractive cost of manufacture.

The present disclosure includes adding a bulk material to create the vias and other circuit geometry to supplement or replace the traditional circuit production techniques. This approach enables the production of very small low resistance vias to increase density and reduce line and feature pitch of the circuits as well as a host of electrical enhancements that provide an electrical interconnect that may prove to be superior to the traditional methods.

The present high performance electrical interconnect can be treated as a system of its own by incorporating electrical devices or other passive and active function, such as for example, ground planes, power planes, electrical connections to other circuit members, dielectric layers, conductive traces, transistors, capacitors, resistors, RF antennae, shielding, filters, signal or power altering and enhancing devices, memory devices, embedded IC, and the like. In some embodiments, the electrical devices can be formed using printing technology, adding intelligence to the interconnect assembly.

The present high performance electrical interconnect can be produced digitally, without tooling or costly artwork. The high performance electrical interconnect can be produced as a "Green" product, with dramatic reductions in environmental issues related to the production of conventional flexible circuits.

The vias and associated circuit geometry can be printed in a variety of shapes and sizes, depending on the terminal structure on the circuit members. The contact members and vias can be positioned at a variety of locations, heights, or spacing to match the parameters of existing connections.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

The circuit geometry preferably has conductive traces that have substantially rectangular cross-sectional shapes, corresponding to the recesses. The use of additive printing processes permits conductive material, non-conductive material, and semi-conductive material to be located on a single layer.

In one embodiment, pre-formed conductive trace materials are located in the recesses. The recesses are than plated to form conductive traces with substantially rectangular cross-sectional shapes. In another embodiment, a conductive foil is pressed into at least a portion of the recesses. The conductive foil is sheared along edges of the recesses. The excess conductive foil not located in the recesses is removed and the recesses are plated to form conductive traces with substantially rectangular cross-sectional shapes.

At least one electrical device is optionally printed on a dielectric layer and electrically coupled to at least a portion of the circuit geometry. Optical quality materials can be printed or deposited in at least a portion of the recesses to form optical circuit geometries. Alternatively, optical fibers can be located in the recesses.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

In one embodiment, the electrical interconnect includes a socket substrate and a plurality of electrically conductive contact members. The socket substrate has a first layer with a plurality of openings configured to receive solder balls on the BGA device and has a second layer with a plurality of slots defined therethrough that correspond to the plurality of openings. The contact members may be disposed in the openings in the first layer and through the plurality of slots of the second layer of the socket substrate. Each contact member is configured to electrically couple a solder ball on the BGA device to the PCB. Each contact member comprises a contact plate with a notch defined at a solder ball interface region. The notch may be configured to be positioned in the opening of the first layer. The notch may be configured to receive a portion of the solder ball such that a solder ball positioned in the opening is nested within the notch and in contact with the contact plate.

In one embodiment, the plurality of contact members are configured to retain the solder ball of the BGA device without reflow of the solder ball. Accordingly, the solder ball of the BGA device is removable from the contact member without reflow of the solder ball.

Each of the plurality of contact members may comprise contact tips configured to extend inward toward a middle of the respective opening. The contact tips may be configured to score the solder ball as it is inserted into the contact member. The contact tips may electrically couple with the solder ball when the solder ball is positioned in the respective opening. The notch of a contact plate may simultaneously engage a top portion, a center diameter and a lower portion of the solder ball of the BGA device.

In another embodiment, each of the plurality of contact members may include a plurality of contact plates. The plurality of contact plates may be configured to engage each other and mate together in a middle.

In another embodiment, at least one electrical device is printed on the socket substrate and electrically coupled to at least a one of the contact members.

The present disclosure is also directed to an electrical interconnect assembly. A housing may retain an electrical interconnect, such as the embodiments outlined above. The assembly may also include a BGA device with solder balls located in the openings of the socket substrate and electrically coupled to the contact tips of the contact members. The assembly may also include a PCB soldered to a lower portion of the contact members.

The present disclosure is also directed to an electrical interconnect including a socket substrate and a plurality of conductive contact members. The contact members may be disposed in openings in a first layer of the socket substrate and through a plurality of slots through a second layer of the socket substrate. The contact members are configured to receive and retain a portion of a solder ball of the BGA device. The solder ball, when positioned in the opening, may be nested within the contact member and removable from the contact member and the opening without reflow.

The present disclosure is also directed to a method of making a surface mount electrical interconnect to provide an interface between a PCB and solder balls on a BGA device. The method may include forming the socket substrate. The method may also include inserting a plurality of contact members within openings in a first layer of the socket substrate and through a slot through a second layer of the socket substrate.

In another embodiment, at least one electrical device is printed on the socket substrate and electrically coupled to at least a one of the contact members.

BRIEF DESCRIPTION OF THE SEVERAL VIEWS OF THE DRAWING

FIGS. 2A, 2B, and 2C illustrate an electrical interconnect in accordance with another embodiment of the present disclosure.

FIG. 7 illustrates an electrical interconnect with on-board electrical devices in accordance with an embodiment of the present disclosure.

FIG. 8 illustrates an alternate electrical interconnect with on-board electrical devices in accordance with an embodiment of the present disclosure.

DETAILED DESCRIPTION OF THE INVENTION

A high performance electrical interconnect according to the present disclosure may permit fine contact-to-contact spacing (pitch) on the order of less than 1.0 mm pitch, and more preferably a pitch of less than about 0.7 millimeter, and most preferably a pitch of less than about 0.4 millimeter. Such fine pitch high performance electrical interconnects are especially useful for communications, wireless, and memory devices.

The present high performance electrical interconnect can be configured as a low cost, high signal performance interconnect assembly, which has a low profile that is particularly useful for desktop and mobile PC applications. IC devices can be installed and uninstalled without the need to reflow solder. The solder-free electrical connection of the IC devices is environmentally friendly.

The embodiments of the present disclosure may enable a user to directly socket a ball grid array ("BGA") device to a printed circuit board ("PCB") without reflowing solder balls of the BGA device. Moreover, the BGA device may also be removable and replaceable without a need for rework or reflow of the solder balls. The socket itself may be soldered to the PCB. The socket may include upper contact structures that are shaped to accept the balls of the BGA device in a manner that retains the device, but allows the device to be lifted out. The BGA device may be inserted in to the socket with low enough force to enable insertion by hand, while still providing stable contact resistance and reliable connection. Moreover, the extraction force relative to the insertion force is such that the device can be easily removed by hand or with the aid of a tool, but without breaking solder joints between the contact and the PCB and/or without breaking the joint from the device to the solder ball on the package.

Figure 1A:
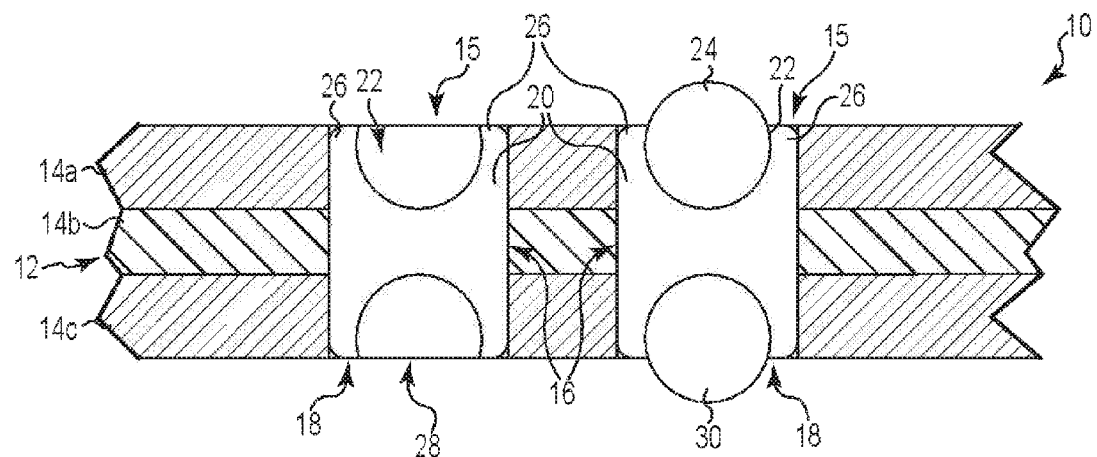
FIGS. 1A and 1B illustrate an electrical interconnect in accordance with an embodiment of the present disclosure.
Figure 1B:
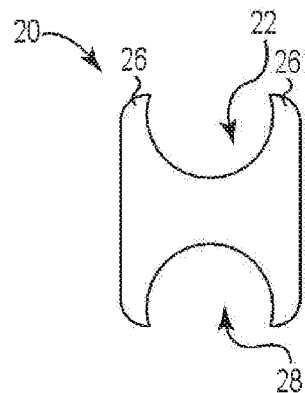

FIGS. 1A and 1B illustrate an electrical interconnect 10 in accordance with one embodiment of the present disclosure. FIG. 1A illustrates a partial sectional view of a portion of the electrical interconnect 10. The electrical interconnect may include a socket housing formed of a socket substrate 12 and a plurality of contact members 18. The socket substrate 12 may include multiple layers 14a, 14b, 14c (collectively 14) and contact members 18 inserted through the socket substrate 12. The layers 14 may permit the creation of internal features, undercuts, or cavities that are difficult or typically not possible to make using conventional molding or machining techniques, referred to herein as a "non-moldable feature." In one embodiment, the layers 14 may be discrete structures laminated or bonded together. Alternatively, the socket substrate 12 may be formed as a series of sequentially printed layers 14. As used herein, "bond" or "bonding" refers to, for example, adhesive bonding, solvent bonding, ultrasonic welding, thermal bonding, or any other techniques suitable for attaching adjacent layers to a substrate.

In one embodiment, a middle layer 14b of the socket substrate 12 may have a slot 16 configured to press fit a center region of the contact member 18. As can be appreciated, the socket substrate 12 may comprise a plurality of middle layers. An upper layer 14a and a lower layer 14c of the socket substrate may include openings 15 having a diameter configured to match the outer edges of the contact member 18. The openings 15 may be substantially circular or shaped to accommodate the contact members 18 and a solder ball 24 of a BGA device.

The contact members 18 may comprise a single contact plate 20 having a notch 22 (or "bite") removed at the solder ball interface region. FIG. 1B is a side elevation view of a contact plate 20, according to one embodiment. Referring collectively to FIGS. 1A and 1B, the contact plate 20 may be a flat plate having a width and/or length substantially greater than a thickness. The contact plate 20 may be inserted into a slot through the middle layer 14b of the socket substrate 12. In the illustrated embodiment, the contact plate 20 may be formed of copper or a copper alloy, such as CuNiSi.

The notch 22 in the contact plate 20 may be sized and shaped to mate with the solder ball 24 such that the solder ball 24 nests within the notch 22. For example, in the illustrated embodiment, the notch 22 may have a substantially semicircular shape with a diameter matching the diameter of the solder ball 24. The portion of the contact plate 20 having the notch 22 may be disposed within the opening 15 of the upper layer 14a of the socket substrate 12. The contact tips 26 of the contact plate 20 may be formed to extend the arc of the notch 22 beyond the quadrants of a diameter defining a semicircular shape. In other words, the contact tips 26 may be configured to engage the upper quadrants of the solder ball 24 by extending slightly inward toward a middle or center of the opening 15 in the upper layer 14a of the socket substrate 12.

The notch 22 may simultaneously engage a top portion, a center diameter, and a lower portion of the solder ball 24. The tips 26 may extend an arc of the notch 22 slightly greater than 180 degrees (e.g., slightly greater than a semicircle) such that during insertion into the notch 22 the solder ball may be scored to remove oxides and upon seating there may be a slight engagement of the tips 26 beyond the lower quadrants, on the upper quadrants, of the solder ball 24 to retain the solder ball 24 in place. For example, the arc of the notch may extend between 180 degrees and 200 degrees.

In the illustrated embodiment, a lower portion of the contact plate 20 may include a lower notch 28 configured to engage a lower solder ball 30 of a PCB. The lower notch 28 may be configured to couple the contact plate 20 to the lower solder ball 30 in a manner similar to the coupling achieved by the notch 22 to the solder ball 24. The lower solder ball 30 may be sized and configured to be positioned loosely adjacent the lower notch 28 and pressed into the lower notch 28 of the contact plate 20. The lower solder ball 30 may be welded to the contact member 18 upon reflow. As can be appreciated, the contact plate 20 may be coupled to the PCB in other ways. For example, the lower portion of the contact plate 20 may be in electrical contact with a contact pad on a lower surface of the lower layer 14c of the socket substrate 12. The contact pad may be printed on the lower surface of the lower layer 14c, for example, after the contact plate 20 is inserted into the opening 15 and through the slot 16. Printing features, such as a contact pad on the lower surface of the lower layer, is described in greater detail below. A solder ball may be used to couple the contact pad to the PCB.

FIGS. 2A, 2B, and 2C illustrate an electrical interconnect 40 in accordance with another embodiment of the present disclosure. FIG. 2A illustrates a partial sectional view of a portion of the electrical interconnect 40. The electrical interconnect 40 may have a similar principle as the electrical interconnect 10 of FIGS. 1A and 1B and may include a socket housing formed of a multi-layered socket substrate 42 and a plurality of contact members 48. The socket substrate 42 may be similar to the socket substrate 12 described above, having an upper layer 44a, one or more middle layers 44b, and a lower layer 44c. The upper layer 44a may include a plurality of openings 45 configured to accommodate a solder ball 24 of the BGA device. The middle layer 44b may include a plurality of slots 46 corresponding to the plurality of openings 45 and arranged in an "X" or "+" shaped configuration.

The contact members 48 may comprise a pair of contact plates 50. The contact plates 50 may be configured to engage each other and mate in the middle. For example, the contact plates 50 may include mating notches 51 configured to enable the contact plates 50 to mate together in the middle. A first contact plate 50a may be inserted into an opening 45 of the upper layer 44a and through a slot 46 in a middle layer 44b of the socket substrate 42. A second contact plate 50b may be inserted with the mating notches 51 engaged to mate the two contact plates 50 together. In the illustrated embodiment, the first contact plate 50a and the second contact plate 50b are identical, but mirrored for assembly.

FIG. 2B is a side elevation view of the first contact plate 50a and the second contact plate 50b, according to one embodiment. FIG. 2C is a top view of the first contact plate 50a and the second plate 50b positioned in an opening 45 through the first layer 44a of the socket substrate 42. As illustrated, a top view of the contact plates 50 reveals an "x" or "+" shape configuration of the contact plates 50.

Referring collectively to FIGS. 2A, 2B, and 2C, the contact plates 50 may be a flat plates having a width and length substantially greater than a thickness. In the illustrated embodiment, the contact plates 50 may be formed of copper or a copper alloy, such as CuNiSi. The contact plates 50 may include notches 52 that may be sized and shaped to mate with a solder ball 24 of the BGA device. The first contact plate 50a includes a notch 52a and the second contact plate 50b includes a notch 52b (collectively notches 52). For example, in the illustrated embodiment, the notches 52 may have a substantially semicircular shape with a diameter matching the diameter of the solder ball 24. The contact tips 56 of the contact plates 50 may be formed to extend the arcs of the notches 52 beyond the quadrants of a diameter forming a semicircular shape. In other words, the contact tips 56 may be configured to engage the upper quadrants of the solder ball 24. The notches 52 may simultaneously engage a top portion, a center diameter, and a lower portion of the solder ball 24. The tips 56 may extend an arc of the notches 52 slightly greater than 180 degrees (e.g., slightly greater than a semicircle) such that during insertion into the notches 52 the solder ball 24 may be scored to remove oxides and upon seating there may be a slight engagement of the tips 56 beyond the lower quadrants, on the upper quadrants, of the solder ball 24 to retain the solder ball 24 in place. The first contact plate 50a and second contact plate 50b may provide enhanced securement of the solder ball 24. The notches 52 arranged in an "x" or "+" shape configuration may form a basket to receive and engage the solder ball 24.

In the illustrated embodiment, a lower portion of the contact plates 50 may include a lower notch 58 configured to engage a lower solder ball 30 of a PCB. The lower notch 58 may be configured to couple the contact plate 50 to the lower solder ball 30 in a manner similar to that of the notch 52 and the solder ball 24. The lower solder ball 30 may be sized and configured to be positioned loosely adjacent the lower notch 58 and pressed into the lower notch 58 of the contact plate 50. The lower solder ball 30 may be welded to the contact member 48 upon reflow. As can be appreciated, the contact members 48 may be coupled to the PCB in other ways. For example, the lower portion of the contact plates 50 may be in electrical contact with a contact pad on a lower surface of the lower layer 44*c* of the socket substrate 42. The contact pad may be printed on the lower surface of the lower layer 44*c*, for example, after the contact plate 50 is inserted into the opening 45 and through the slot 46. A solder ball may be used to couple the contact pad to the PCB.

Figure 3A:
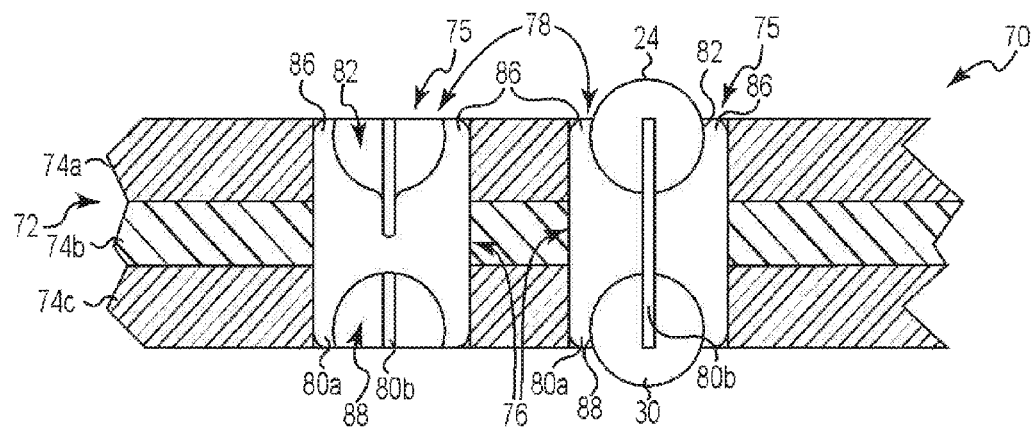
FIGS. 3A, 3B, and 3C illustrate an electrical interconnect in accordance with another embodiment of the present disclosure.
Figure 3B:
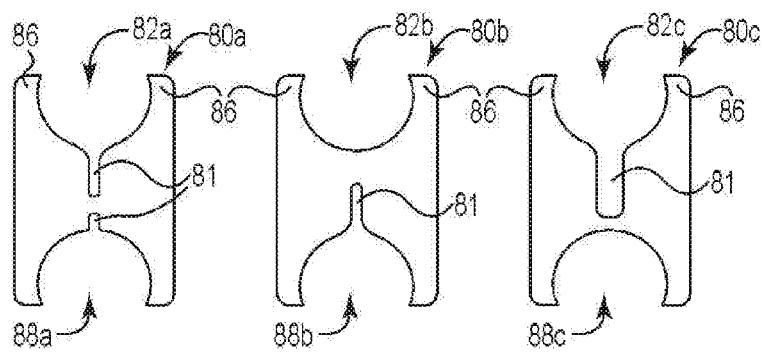
Figure 3C:
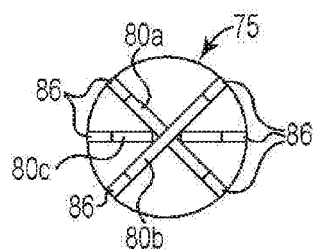

FIGS. 3A, 3B, and 3C illustrate an electrical interconnect 70 in accordance with another embodiment of the present disclosure. The electrical interconnect 70 may be similar to the electrical interconnects 10, 40 described above and the contact members 78 include a third contact plate 80*c*. FIG. 3A illustrates a partial sectional view of a portion of the electrical interconnect 70. The electrical interconnect 70 may have a similar principle and include a socket housing formed of a multi layered socket substrate 72 and a plurality of contact members 78. The socket substrate 72 may be similar to the socket substrates described above, having an upper layer 74*a*, one or more middle layers 74*b*, and a lower layer 74*c*. The upper layer 74*a* may include a plurality of openings 75 configured to accommodate a solder ball 24 of the BGA device. The middle layer 74*b* may include a plurality of slots 76 corresponding to the plurality of openings 75 and arranged in, a six-pointed star shaped configuration.

The contact members 78 may comprise three contact plates 80. The contact plates 80 may be configured to engage each other and mate in the middle. For example, the contact plates 80 may include mating notches 81 configured to enable the contact plates 80 to mate together in the middle. For example, a third contact plate 80*c* may have a slightly larger mating notch 81. The third contact plate 80*c* may be inserted into an opening 75 of the upper layer 74*a* and through a slot 76 in the middle layer 74*b* of the socket substrate 72. A first contact plate 80*a* may then be inserted into the opening 75 of the upper layer 74*a* and through a slot 76 in the middle layer 74*b* of the socket substrate 72, thereby coupling in the middle the first contact plate 80*a* and the third contact plate 80*c*.

The mating notches 81 are engaged to mate the first contact plate 80*a* and the third contact plate 80*c*. A second contact plate 80*b* may be inserted into the opening 75 and through a slot 76, thereby coupling in the middle the second contact plate 80*b* with the first contact plate 80*a* and third contact plate 80*c*. The mating notches 81 are engaged to mate the three contact plates 80 together. FIG. 2B is a side elevation view of the first contact plate 80*a*, the second contact plate 80*b*, and the third contact plate 80*c*, according to one embodiment. FIG. 2C is a top view of the first contact plate 80*a*, the second plate 80*b*, and the third contact plate 80*c* positioned in an opening 75 through the first layer 74*a* of the socket substrate 72. The top view of the contact plates 80 shows the six-pointed star shaped configuration of the contact plates 80.

Referring collectively to FIGS. 3A, 3B, and 3C, the contact plates 80 may be flat plates having a width and length substantially greater than a thickness. In the illustrated embodiment, the contact plates 80 may be formed of copper or a copper alloy, such as CuNiSi. The contact plates 80 may include notches 82 that may be sized and shaped to mate with a solder ball 24 of the BGA device. The first contact plate 80*a* includes a notch 82*a*. The second contact plate 80*b* includes a notch 82*b*. The third contact plate 80*c* includes a notch 82*c*. (The notches 82*a*, 82*b*, 82*c* may collectively be referenced as notches 82). For example, in the illustrated embodiment, the notches 82 may have a substantially semicircular shape with a diameter matching the diameter of the solder ball 24. The contact tips 86 of the contact plates 80 may be formed to extend the arcs of the notches 82 beyond the quadrants of a diameter forming a semicircular shape. In other words, the contact tips 86 may be configured to engage the upper quadrants of the solder ball 24. The notches 82 may simultaneously engage a top portion, a center diameter, and a lower portion of the solder ball 24. The tips 86 may extend an arc of the notches 82 slightly greater than 180 degrees (e.g., slightly greater than a semicircle) such that during insertion into the notches 82 the solder ball 24 may be scored to remove oxides and upon seating there may be a slight engagement of the tips 86 beyond the lower quadrants, on the upper quadrants, of the solder ball 24 to retain the solder ball 24 in place. The combination of the first contact plate 80*a*, the second contact plate 80*b*, and the third contact plate 80*c* may provide enhanced securement of the solder ball 24.

In the illustrated embodiment, a lower portion of the contact plate 80 may include a lower notch 88 configured to engage a lower solder ball 30 of a PCB. The lower notch 88 may be configured to couple the contact plate 80 to the lower solder ball 30 in a manner similar to that of the notch 82 and the solder ball 24. The lower solder ball 30 may be sized and configured to be positioned loosely adjacent the lower notch 88 and pressed into the lower notch 88 of the contact plate 80. The lower solder ball 30 may be welded to the contact member 78 upon reflow. As can be appreciated, the contact members 78 may be coupled to the PCB in other ways. For example, the lower portion of the contact plates 80 may be in electrical contact with a contact pad on a lower surface of the lower layer 74*c* of the socket substrate 72. The contact pad may be printed on the lower surface of the lower layer 74*c*, for example, after the contact plates 80 are inserted into the opening 75 and through the slots 76. A solder ball may be used to couple the contact pad to the PCB.

Figure 4A:
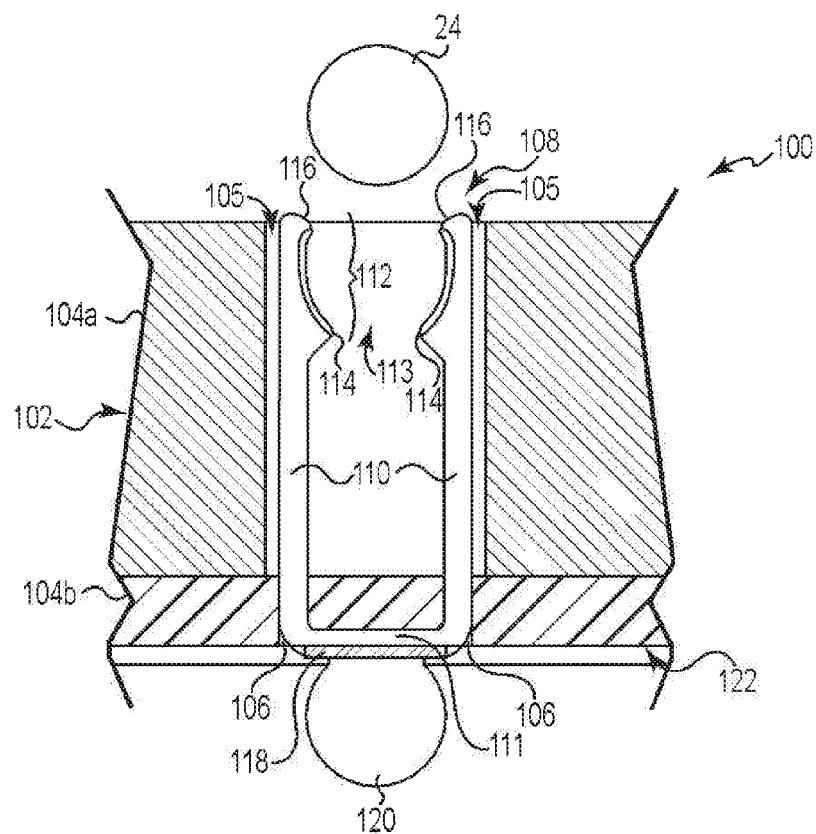
FIGS. 4A and 4B illustrate an electrical interconnect in accordance with another embodiment of the present disclosure.
Figure 4B:
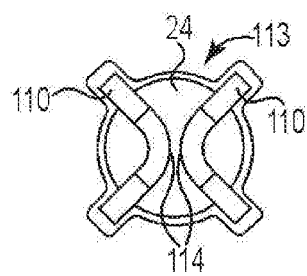

FIGS. 4A and 4B illustrate an electrical interconnect 100 in accordance with another embodiment of the present disclosure. FIG. 4A illustrates a partial sectional view of a portion of the electrical interconnect 100. The electrical interconnect 100 may include a socket housing formed of a multi-layered socket substrate 102 and a plurality of contact members 108. The socket substrate 102 may have a first layer 104*a* (e.g., an upper layer) and a second layer 104*b* (e.g., a lower layer). The first layer 104*a* may comprise a plurality of openings 105 each configured to accommodate one of the plurality of contact members 108. The second layer 104*b* of the socket substrate 102 may include slots 106 arranged in an appropriate geometry to allow beams 110 of the contact members 108 to pass through from a bottom surface 122 of the second layer 104*b*. The openings 105 may be configured to allow the contact beams 110 to deflect outwardly to receive the solder ball 24. A diameter of the openings 105 may facilitate rough location of the solder ball 24 during insertion and may limit or prevent over deflection of the contact beams 110.

The electrical interconnect 100 may enable a user to directly socket a BGA device without reflow to the PCB. Often, there is a desire to have the BGA device removable and replaceable without the need for rework or reflow of the solder balls 24 of the BGA. The upper portions of the contact members 108 may be shaped to accept the solder ball 24 on the BGA device in a manner that retains the solder ball 24, but allows the solder ball 24 to be lifted out or otherwise removed. The electrical interconnect 100 itself may be soldered to the PCB. A challenge with an embodiment of this type is to create an interface between the solder ball 24 on the BGA device and the contact members 108 such that the BGA device can be inserted with low enough force to enable insertion by hand, while still providing stable contact resistance and reliable connection. Related to this challenge is the extraction force relative to insertion force such that the device can be easily removed by hand or with the aid of a tool without breaking solder joints between the contact member 108 and the PCB as well as the joint from the BGA device to the solder ball 24.

The contact members 108 may comprise a pair of contact beams 110 joined by a contact base 111. The contact members 108 may be formed from copper alloy. Formation of the contact members 108 may begin with a flat blank in a "U" shape, with the sides of the U forming the contact beams 110 and the bottom of the U forming the contact base 111. The contact beams 110 may function as spring arms configured to deflect outward during insertion of the solder ball 24 into the opening 105. The contact beams 110 may have upper portions 112 shaped to form a basket 113 that provides a nesting effect against the solder ball 24. The basket 113 may simultaneously engage a top portion, a center diameter, and a lower portion of the solder ball 24. The contact beams 110 may include contact tips 116 disposed at the upper end of the contact beams 110 at a top edge of the basket 113. The contact tips 116 may be configured to engage an upper quadrant of the solder ball 24 to retain the solder ball 24 in place in the basket 113 The solder ball interface region of the contact tips 116 may be coined or beveled to define a knife or blade edge effect at a bevel (e.g., 30 degrees). The contact tips 116 may be configured to score the solder ball 24 to remove oxides.

The contact beams 110 may be formed in the same shape, but arranged opposing each other to create a four-point or "X" interface with the solder ball 24, as shown in FIG. 4B. FIG. 4B illustrates a bottom view of a solder ball 24 engaged in the basket 113 of the contact member 108 and portraying the X interface with the solder ball 24. The basket 113 may be designed to "loosely" or slightly cradle the solder ball 24 of the BGA device after insertion, and allow for a relatively low insertion and extraction force. As can be appreciated, a mechanical aid or lid can be added to assist with holding the BGA device in place if needed. As can also be appreciated, a diameter of the solder ball 24 may be reduced such that it is less than a diameter of the basket 113. The size reduction of the solder ball may facilitate electrical performance and impedance matching.

Referring collectively to FIGS. 4A and 4B, the contact beams 110 may include a support lip 114 that may define a lower portion of the basket 113 and that may be configured to engage a lower quadrant of the solder ball 24 and enable a desired nesting effect on the solder ball 24. The support lips 114 may extend inward from the contact beams 110 toward a middle of the opening 105 and a middle of the basket 113. The solder ball 24 may be pushed past the contact tips 116 as the contact beams 110 deflect outward. As the solder ball 24 passes the contact tips 116, the contact beams 110 retract to enable the solder ball 24 to seat against the support lips 114 in the manner shown in FIG. 4B.

Referring again to FIG. 4A, the socket substrate 102 may include a copper pad 118 configured to abut the contact base 111 and having appropriate pass-though geometry to allow insertion of the contact beams 110 into the openings 105. After insertion of the contact beams 110, the interface between the contact base 111 and the copper pad 118 may be printed with solder mask to define a solder ball attachment point, seal off the contact base 111, and aid with retention of the contact member 108.

As shown in FIG. 4A, a lower solder ball 120 may be coupled to the copper pad 118 and/or the contact base 111. The lower solder ball 120 may be reflowed to couple the electrical interconnect 100 to a PCB.

Figure 5A:
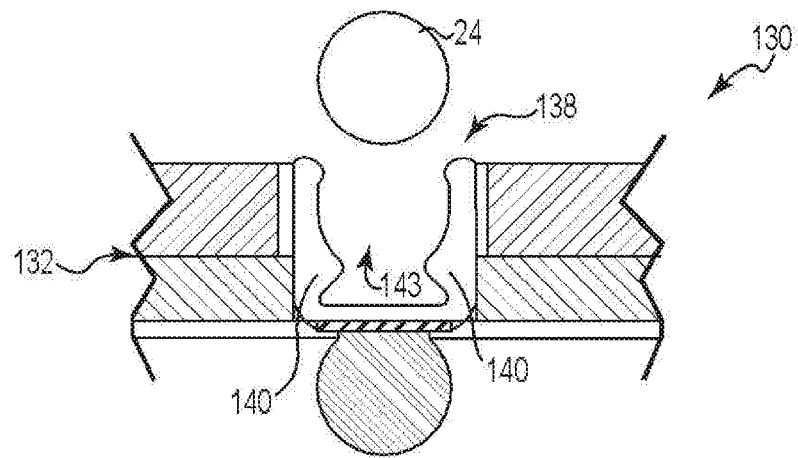
FIGS. 5A and 5B illustrate an electrical interconnect in accordance with another embodiment of the present disclosure.
Figure 5B:
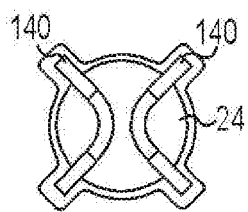

FIGS. 5A and 5B illustrate an electrical interconnect 130 in accordance with another embodiment of the present disclosure. The electrical interconnect 130 is simply a shorter embodiment of the electrical interconnect 100 of FIGS. 4A and 4B. Specifically, contact members 138 of the electrical interconnect 130 may have contact beams 140 that are shorter than the contact beams 110 of the electrical interconnect 100. The contact beams 140 of the electrical interconnect 130 may be configured to form a basket 143 to provide a nesting effect against the solder ball 24. The shorter configuration may allow for a thinner socket substrate 132.

Figure 6A:
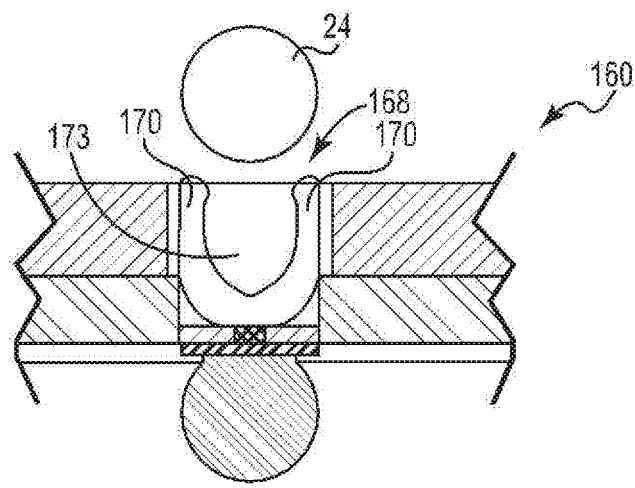
FIGS. 6A, 6B, and 6C illustrate an electrical interconnect in accordance with another embodiment of the present disclosure.
Figure 6B:
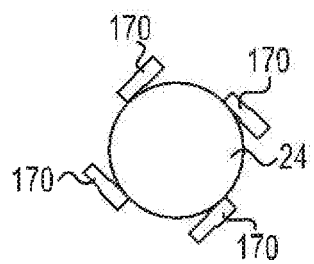
Figure 6C:
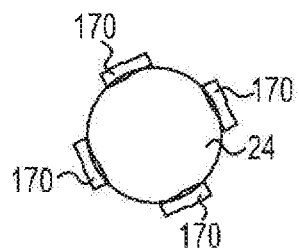

FIGS. 6A, 6B, and 6C illustrate an electrical interconnect 160 in accordance with another embodiment of the present disclosure. The electrical interconnect 160 provides a contact member 168 that may be coined or otherwise formed to have a basket 173 formed of a plurality of contact beams 170 and configured to closely surround the solder ball 24. FIG. 6B illustrates a top view of the contact member 168 showing deflection of the contact beams 170 during insertion of the solder ball 24. FIG. 6C illustrates a top view of the contact member 168 with the contact beams 170 engaging the solder ball 24. The solder ball 24 is nested within the contact beams 170. As can be appreciated, other shapes and configurations of contact members are possible to receive and engage a solder ball 24 of a BGA device and provide a desired nesting effect against the solder ball 24.

FIG. 7 illustrates electrical interconnect 220 with electrical devices 222, such as for example, internal decoupling capacitors, located on substrate 224 in accordance with an embodiment of the present disclosure. Printed conductive traces 226 electrically couple the electrical devices 222 to one or more of the contact pads 228. The electrical devices 222 can be added as discrete components or printed materials, reducing the need for discrete components on the PCB 232 and the integrated circuit device 230. Locating the electrical devices 222 in the semiconductor socket 220 permits integrated circuit manufactures to reduce or eliminate the capacitors currently located on the package 230 and printed circuit board 232. This shift can greatly reduce cost and simplify the package 230 and printed circuit board 232, while improving performance.

The electrical devices 222 can be a power plane, ground plane, capacitor, resistor, filters, signal or power altering and enhancing device, memory device, embedded IC, RF antennae, and the like. The electrical devices 222 can be located on either surface of the substrate 224, or embedded therein. The electrical devices 222 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

Locating such electrical devices 222 on the electrical interconnect 220 improves performance and enables a reduction in the cost of integrated circuit devices and the PCB 232. Integrated circuit manufactures are limited by the pitch that the PCB 232 can accommodate and still keep the printed circuit board to four layers. The integrated circuit makers can manufacture the integrated circuit device 230 with a smaller pitch, but with the pin counts is so high that the printed circuit board 232 likely requires additional layers in order to route all of the signals. The present electrical interconnect 220 also permits integrated circuit manufactures to reduce the pitch of the contacts on the IC device 230, and perform any required signal routing in the electrical interconnect 220, rather than in the printed circuit board 232 or by adding daughter boards to the system.

FIG. 8 illustrates an alternate electrical interconnect 240 with on-board electrical devices 242 in accordance with an embodiment of the present disclosure. The decoupling capacitance 242 can be a discrete embedded or printed electrical device. Contact member 244 provides the electrical connection to the capacitor located on the semiconductor device 246 and solder ball 248 provides the electrical connection to the capacitor located on printed circuit board 250.

Figure 9:
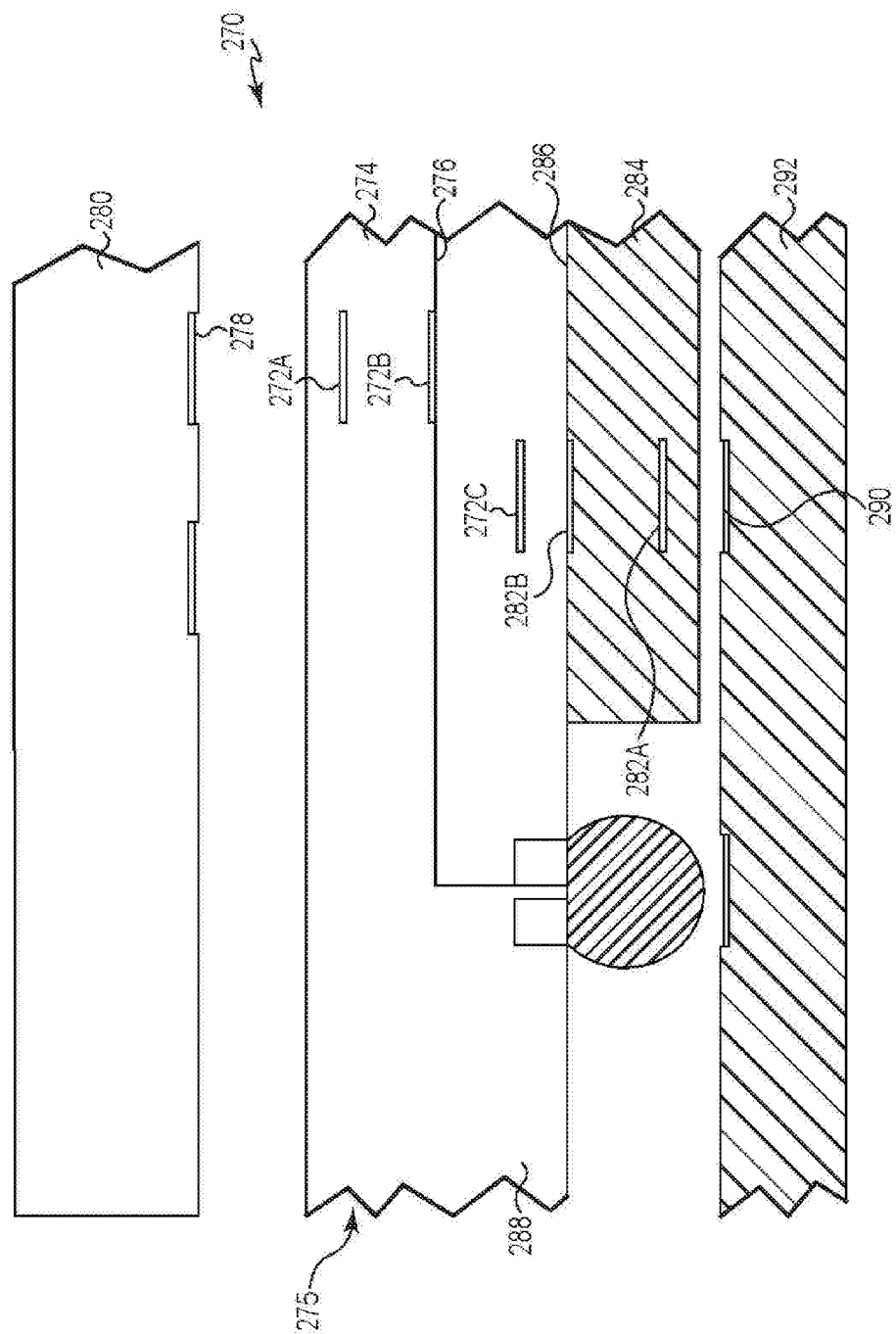
FIG. 9 illustrates an electrical interconnect with capacitive coupling in accordance with an embodiment of the present disclosure.

FIG. 9 is a cross-sectional view of electrical interconnect 270 with various capacitive coupling features in accordance with another embodiment of the present disclosure. A capacitive coupling feature 272A is embedded in layer 274 of the substrate 275. A capacitive coupling feature 272B is located on second surface 276 of the layer 274. The capacitive coupling features 272A, 272B are positioned to electrically couple with contact pad 278 on integrated circuit device 280. The capacitive coupling 272C is embedded in layer 288.

Capacitive coupling feature 282A is embedded in layer 284 of the substrate 275. Capacitive coupling feature 282B is located on first surface 286 of the layer 284. The capacitive coupling feature 282A is positioned to electrically couple with contact pad 290 on the PCB 292. The various capacitive coupling features in the embodiment of FIG. 9 are optionally formed using inkjet printing technology, aerosol printing technology, or other printing technology.

Figure 10:
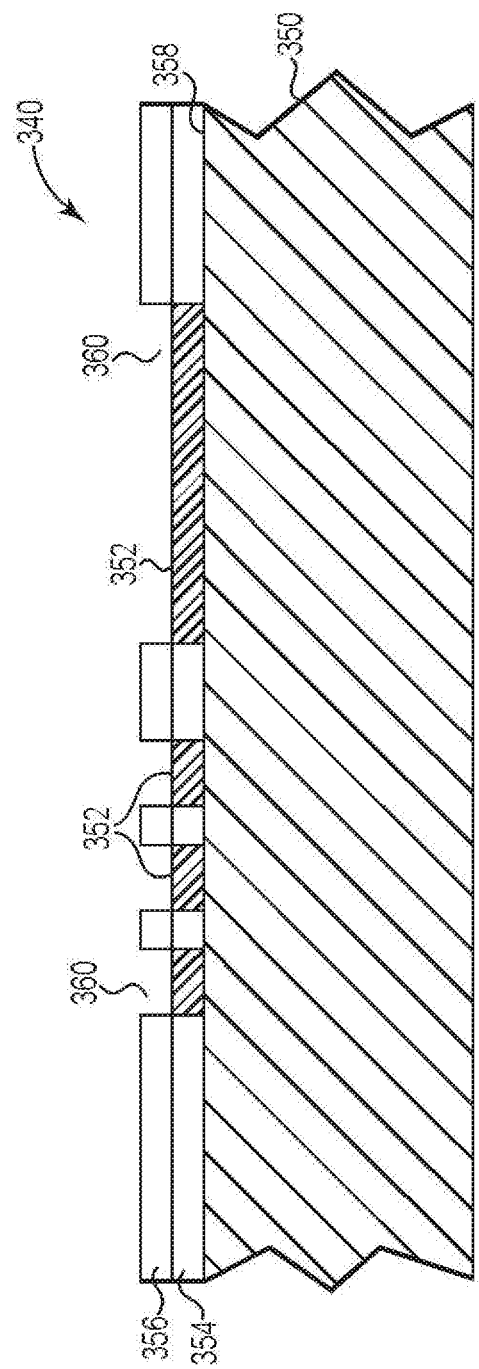
FIG. 10 is a cross-sectional view of a method of making high performance electrical interconnects in accordance with an embodiment of the present disclosure.

FIG. 10 is a side cross-sectional view of a method of making an electrical interconnect 340 using additive processes in accordance with an embodiment of the present disclosure. The process starts similar to a traditional PCB with a first circuitry layer 352 laminated to a stiffening layer or core 350, such as glass-reinforced epoxy laminate sheets (e.g., FR4). The first circuitry layer 352 can be preformed or can be formed using a fine line imaging step is conducted to etch the copper foil 352 as done with many PCB processes. One or more dielectric layers 354, 356 are printed or placed to the surface 358 such that the first circuitry layer 352 is at least partially encased and isolated. In some embodiments, it may be desirable to use a preformed dielectric film to leave air dielectric gaps between traces. Recesses 360 in the dielectric layer 356 to expose circuitry 352 can be formed by printing, embossing, imprinting, chemical etching with a printed mask, or a variety of other techniques.

Figure 11:
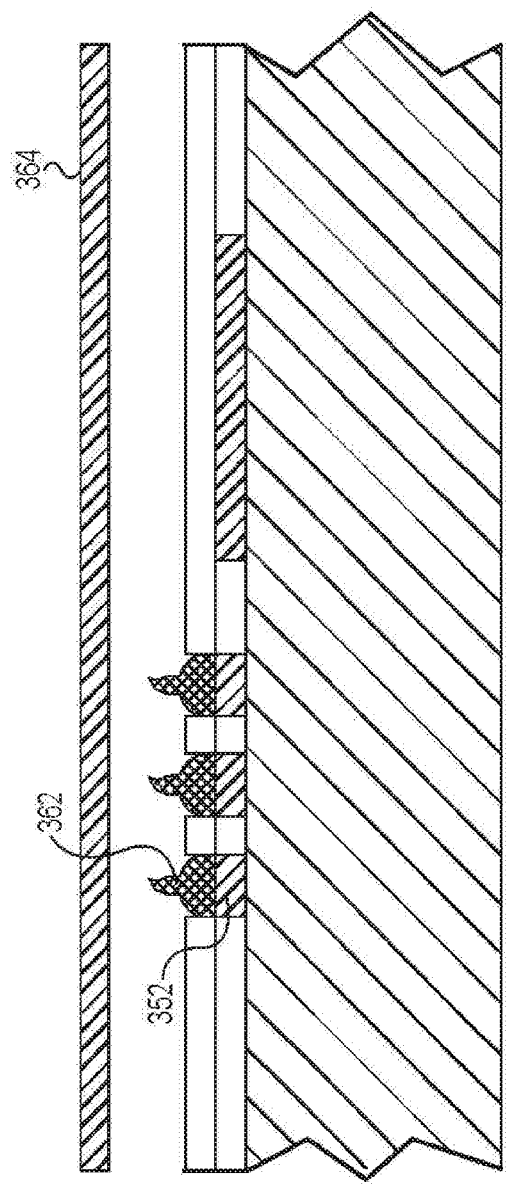
FIG. 11 illustrates via formation on the high performance electrical interconnect of FIG. 10.

As illustrated in FIG. 11, bond points 362, such as for example stud bumps or soldier balls, are added to the exposed circuitry 352 with a traditional bonding machine used in semiconductor packaging applications. Historically, fine gold wire has been used for bonding, with copper seeing increased use in recent years due to the rise in the cost of gold.

Figure 12:
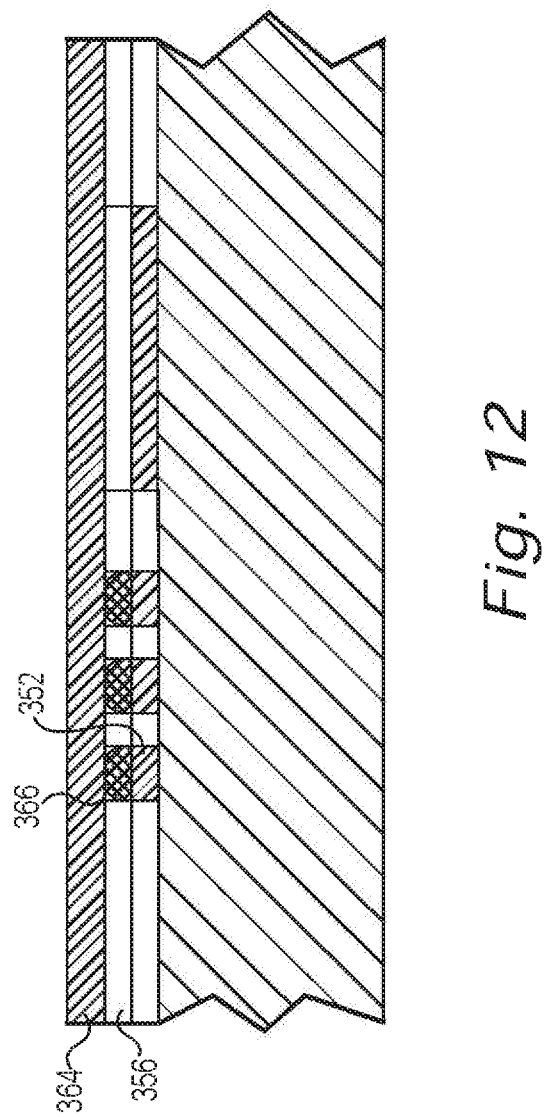
FIG. 12 illustrates application to a second circuitry layer to the high performance electrical interconnect of FIG. 10.

As illustrated in FIG. 12, second circuitry layer 364 is applied to the previous construction such that the bond points 362 are deformed to create the interconnecting vias 366 during the lamination operation. The size and shape of the bond points 362 can be tailored to the ideal condition for deformation without piercing the foil 364.

The second circuitry layer 364 can be pre-etched with the next circuit pattern or can be laminated as a sheet and etched post lamination. In addition, the dielectric material 356 can be left in a tack cure or partial cure state such that a final bond is achieved at final cure. If desired, the bond bumps 362 can be coined planar prior to adding the second circuitry layer 364.

Figure 13:
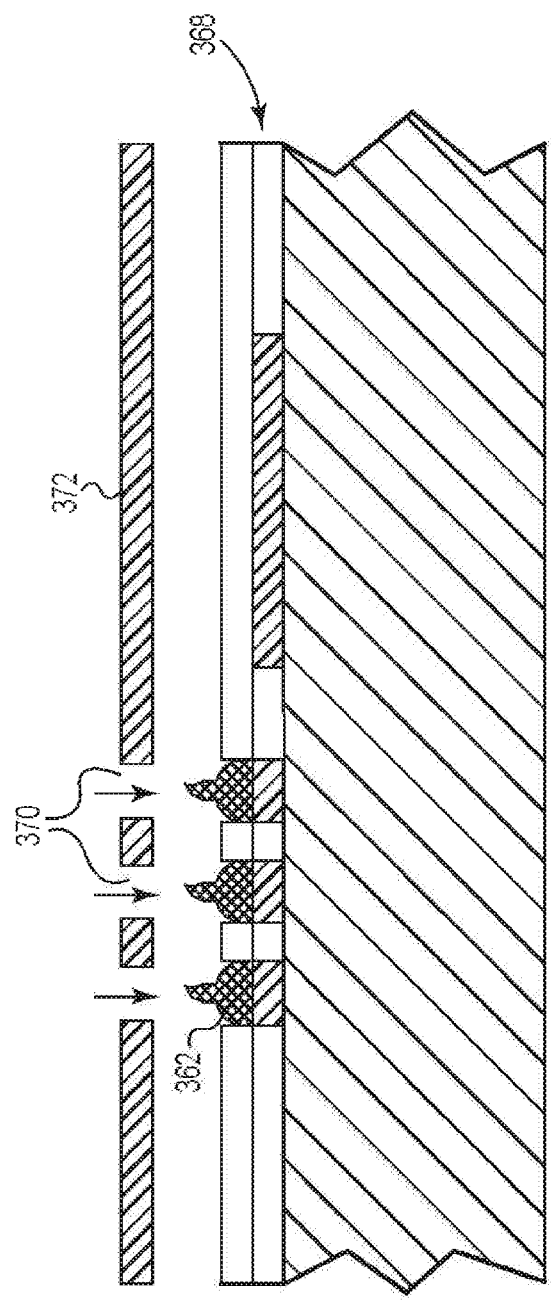
FIG. 13 illustrates an alternate method of making an electrical interconnect in accordance with an embodiment of the present disclosure.
Figure 14:
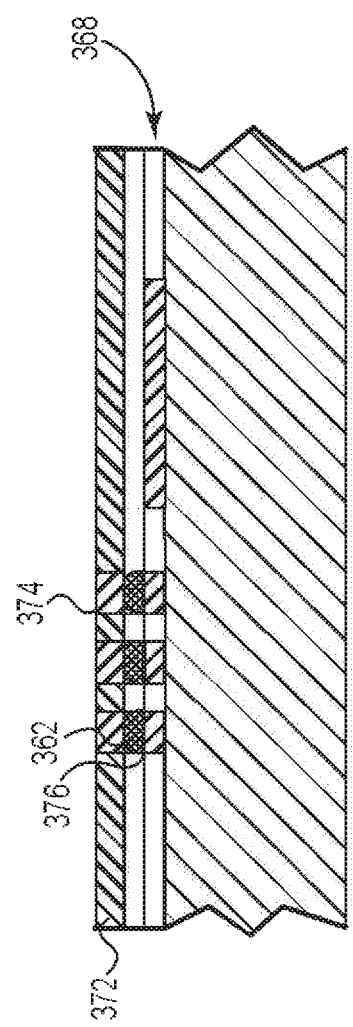
FIG. 14 illustrates application of a second circuitry layer to the electrical interconnect of FIG. 13.

FIGS. 13 and 14 illustrate an alternate interconnect 368 with preformed holes or breaks 370 in the first circuitry layer 372 in accordance with an embodiment of the present disclosure. The holes 370 permit the bond points 362 to extend into the openings 370 or reside near the openings 370 so plating solution 374 can enter the mating region to plate the via structure 376 together. The plating 374 is preferably a corrosion resistant metallic material such as nickel, gold, silver, palladium, or multiple layers thereof. One benefit of the present structure is the material set can be varied layer by layer or altered on a given layer to create some desired performance enhancement not possible with conventional construction.

Figure 15:
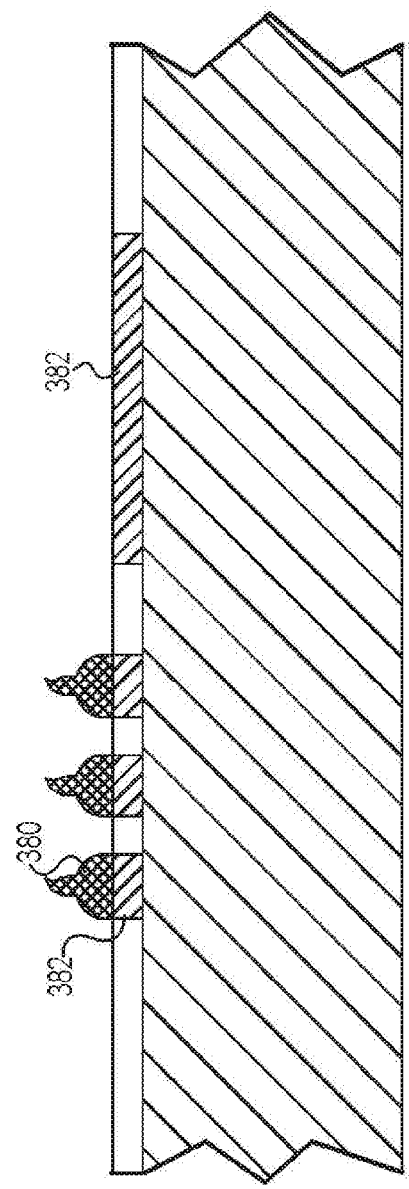
FIG. 15 illustrates another method of making an electrical interconnect in accordance with an embodiment of the present disclosure.
Figure 16:
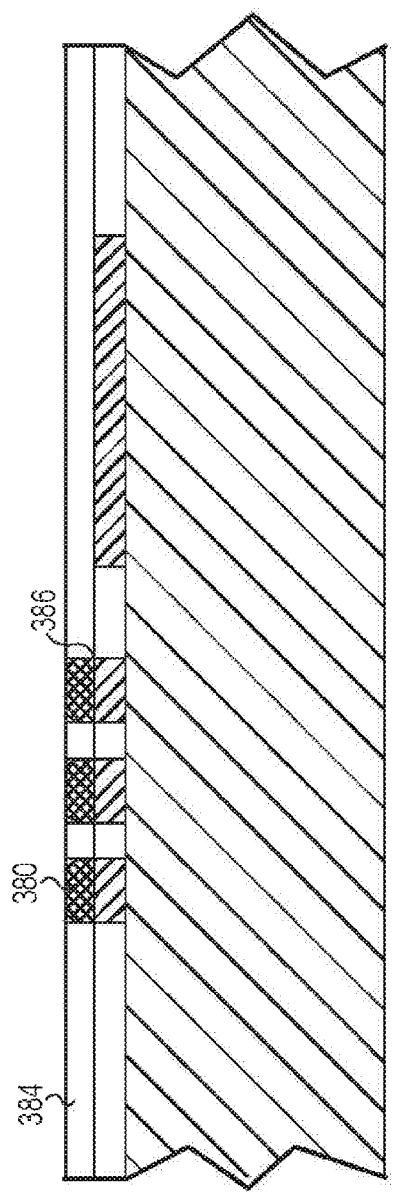
FIG. 16 illustrates via formation on the electrical interconnect of FIG. 15.

FIGS. 15 and 16 illustrate an alternate construction in which bond points 380 are added to the circuitry 382 while it is planar, without upper dielectric layer 384 to provide clearance for the bonding tool to impact the circuitry 382 without encountering or damaging the upper dielectric 384. The bond points 380 can be coined en masse to planarize them either before or after the dielectric layer 384. In one embodiment, the dielectric layer 384 is added with the bond points 380 in place and then imaged to expose the vias 386 for subsequent application of the next pre-etched circuit layer to be placed and plated together (see e.g., FIGS. 11 and 13). The dielectric layer 384 can optionally be filled or doped with a near endless list of enhancement materials to lower dielectric constant, provide thermal management properties, create rigid, flexible, or compliant regions etc.

Figure 17:
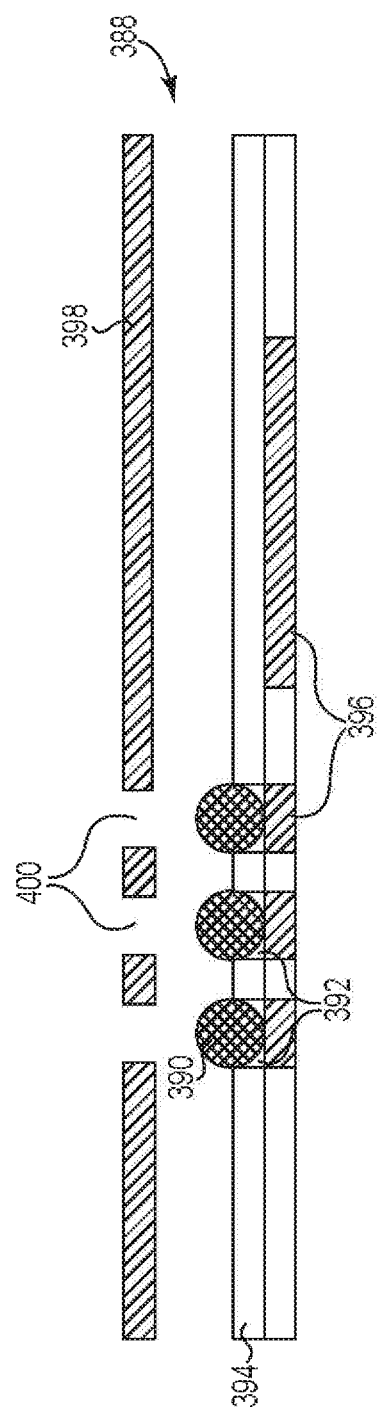
FIG. 17 illustrates an electrical interconnect with bulk metal deposited in recesses to form the vias in accordance with an embodiment of the present disclosure.

FIG. 17 illustrates an alternate electrical interconnect 388 with solid bulk metal 390, such as copper or solder spheres, or plated copper, located in recesses 392 in dielectric layer 394 in accordance with an embodiment of the present disclosure. The bulk metal 390 electrically couples with the lower circuitry layer 396 and the upper circuitry layer 398 with slight deformation or material displacement. In one embodiment, the bulk metal 390 is plated, such as by flowing a plating solution through openings 400 in the upper circuitry 398. It may be possible to provide sufficient engagement to interconnect reliably without the need for plating since the bulk metal 390 is encased within dielectric 394 and environmentally sealed. In the event the bulk metal 390 is solder, the circuit layers 396, 398 can be interconnected when the solder 390 is reflowed with the dielectric 394 acting as a natural solder wicking barrier.

Figure 18:
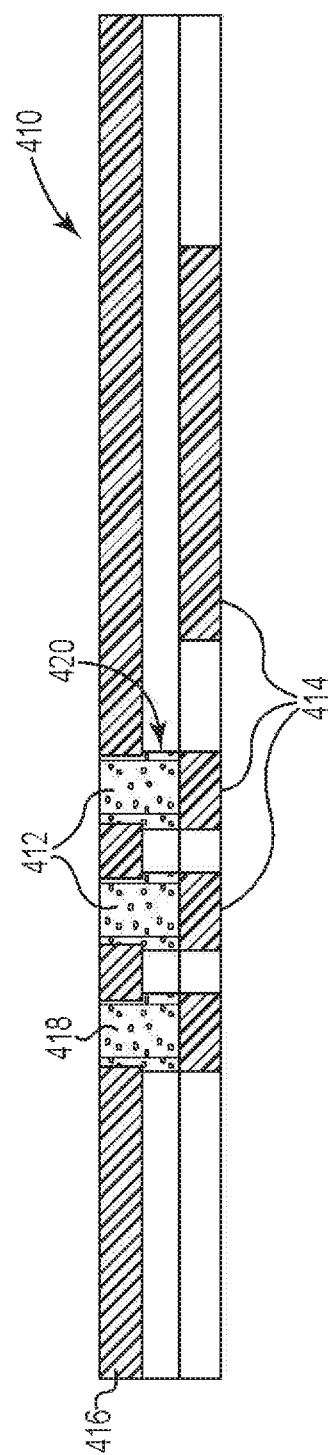
FIG. 18 illustrates an electrical interconnect with recesses filed with conductive particles as the vias in accordance with an embodiment of the present disclosure.

FIG. 18 illustrates an alternate electrical interconnect 410 with reservoirs 412 between circuitry layers 414, 416 that can be filled with loose conductive particles 418 in accordance with an embodiment of the present disclosure. The conductive particles 418 can optionally be sintered, coined, tightly compacted, plated, mixed with an adhesive binder, etc. to create via 420. The method of FIG. 18 can also be used to create the circuitry itself or supplement the etched foil structures. Use of reservoirs containing conductive particles is disclosed in commonly assigned PCT/US2010/36313 entitled Resilient Conductive Electrical Interconnect, filed May 27, 2010, which is hereby incorporated by reference.

Figure 19:
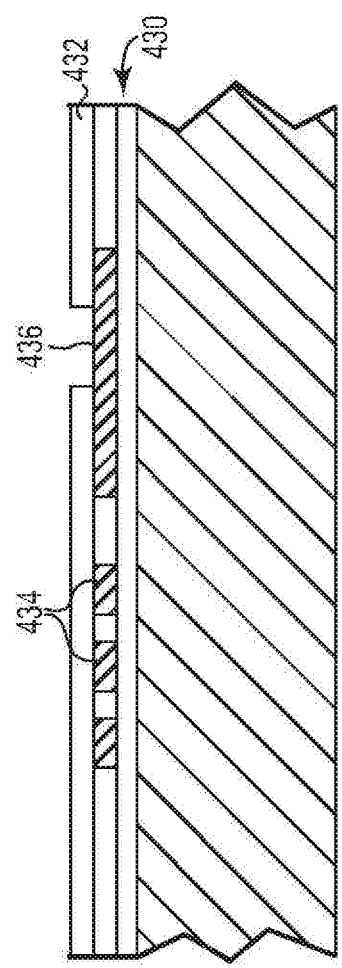
FIG. 19 is a side sectional view of an electrical interconnect in accordance with an embodiment of the present disclosure.

FIG. 19 illustrates an alternate electrical interconnect 430 with an insulating layer 432 applied to the circuit geometry 434. The nature of the printing process allows for selective application of dielectric layer 432 to leave selected portions 436 of the circuit geometry 434 expose if desired. The resulting high performance electrical interconnect 430 can potentially be considered entirely "green" with limited or no chemistry used to produce beyond the direct write materials.

The dielectric layers of the present disclosure may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the dielectric materials are designed to provide electrostatic dissipation or to reduce cross-talk between the traces of the circuit geometry. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 20:
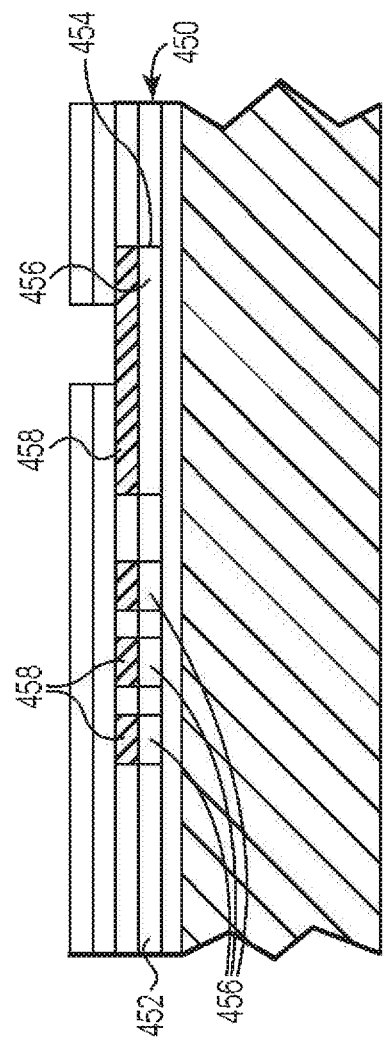
FIG. 20 is a side sectional view of an alternate electrical interconnect with printed compliant material in accordance with an embodiment of the present disclosure.

FIG. 20 illustrates an alternate high performance electrical interconnect 450 in accordance with an embodiment of the present disclosure. Dielectric layer 452 includes openings 454 into which compliant material 456 is printed before formation of circuit geometry 458. The compliant printed material 456 improves reliability during flexure of the electrical interconnect 450.

Figure 21:
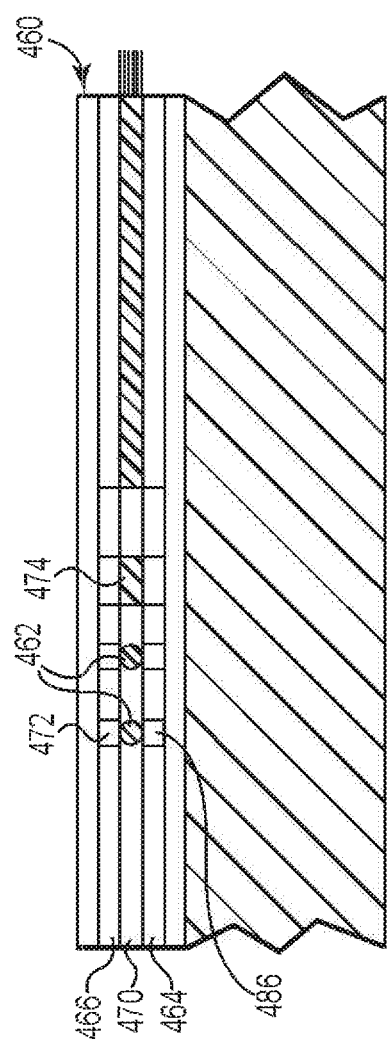
FIG. 21 illustrates an electrical interconnect with optical features in accordance with an embodiment of the present disclosure.

FIG. 21 illustrates an alternate high performance electrical interconnect 460 in accordance with an embodiment of the present disclosure. Optical fibers 462 are located between layers 464, 466 of dielectric material. In one embodiment, optical fibers 462 are positioned over printed compliant layer 468, and dielectric layer 470 is printed over and around the optical fibers 462. A compliant layer 472 is preferably printed above the optical fiber 462 as well. The compliant layers 468, 472 support the optical fibers 462 during flexure. In another embodiment, the dielectric layer 470 is formed or printed with recesses into which the optical fibers 462 are deposited.

In another embodiment, optical quality materials 474 are printed during printing of the high performance electrical interconnect 460. The optical quality material 474 and/or the optical fibers 462 comprise optical circuit geometries. The printing process allows for deposition of coatings in-situ that enhances the optical transmission or reduces loss. The precision of the printing process reduces misalignment issues when the optical materials 474 are optically coupled with another optical structure.

Figure 22:
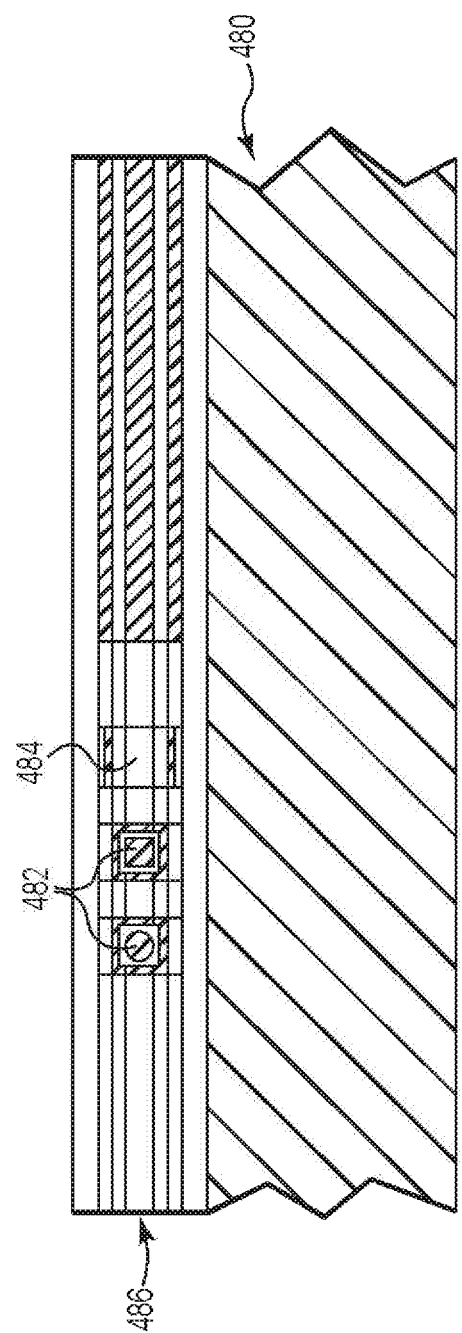
FIG. 22 illustrates an alternate high performance electrical interconnect with optical features in accordance with an embodiment of the present disclosure.

FIG. 22 illustrates another embodiment of a present high performance electrical interconnect 480 in accordance with an embodiment of the present disclosure. Embedded coaxial RF circuits 482 or printed micro strip RF circuits 484 are located with dielectric/metal layers 486. These RF circuits 482, 484 are preferably created by printing dielectrics and metallization geometry.

Figure 23:
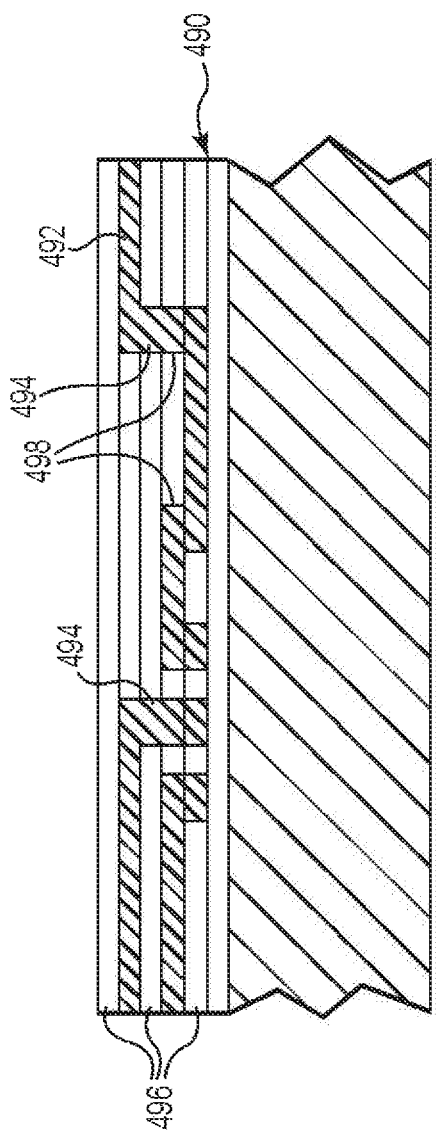
FIG. 23 illustrates an alternate high performance electrical interconnect with printed vias in accordance with an embodiment of the present disclosure.

As illustrated in FIG. 23, use of additive processes allows the creation of a high performance electrical interconnect 490 with inter-circuit, 3D lattice structures 492 having intricate routing schemes. Vias 494 can be printed with each layer, without drilling.

The nature of the printing process permit controlled application of dielectric layers 496 creates recesses 498 that control the location, cross section, material content, and aspect ratio of the conductive traces 492 and the vias 494. Maintaining the conductive traces 492 and vias 494 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 498 to control the aspect ratio of the conductive traces 492 and the vias 494 results in a more rectangular or square cross-section, with the corresponding improvement in signal integrity.

In another embodiment, pre-patterned or pre-etched thin conductive foil circuit traces are transferred to the recesses 498. For example, a pressure sensitive adhesive can be used to retain the copper foil circuit traces in the recesses 498. The trapezoidal cross-sections of the pre-formed conductive foil traces are then post-plated. The plating material fills the open spaces in the recesses 498 not occupied by the foil circuit geometry, resulting in a substantially rectangular or square cross-sectional shape corresponding to the shape of the recesses 498.

In another embodiment, a thin conductive foil is pressed into the recesses 198, and the edges of the recesses 498 acts to cut or shear the conductive foil. The process locates a portion of the conductive foil in the recesses 498, but leaves the negative pattern of the conductive foil not wanted outside and above the recesses 498 for easy removal. Again, the foil in the recesses 498 is preferably post plated to add material to increase the thickness of the conductive traces 492 in the circuit geometry and to fill any voids left between the conductive foil and the recesses 498.

Figure 24:
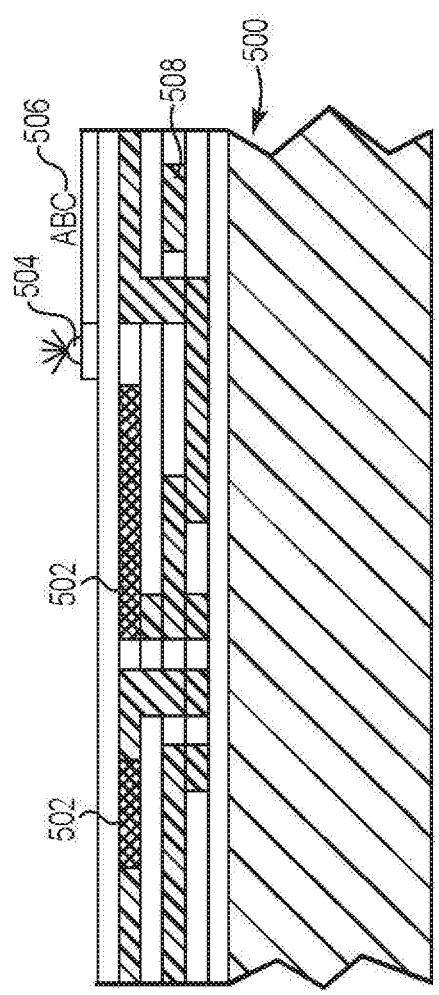
FIG. 24 illustrates an alternate high performance electrical interconnect with printed electrical devices in accordance with an embodiment of the present disclosure.

FIG. 24 illustrates a high performance electrical interconnect 500 with printed electrical devices 502. The electrical devices 502 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices 502 include printed LED indicator 504 and display electronics 506. Geometries can also be printed to provide capacitive coupling 508. Compliant material can be added between circuit geometry, such as discussed above, so the present electrical interconnect can be plugged into a receptacle or socket, supplementing or replacing the need for compliance within the connector.

The electrical devices 502 are preferably printed during construction of the interconnect assembly 500. The electrical devices 502 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 502 can be formed using printing technology, adding intelligence to the high performance electrical interconnect 500. Features that are typically located on other circuit members can be incorporated into the interconnect 500 in accordance with an embodiment of the present disclosure.

The availability of printable silicon inks provides the ability to print electrical devices 502, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.);

and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 502 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layers are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 25:
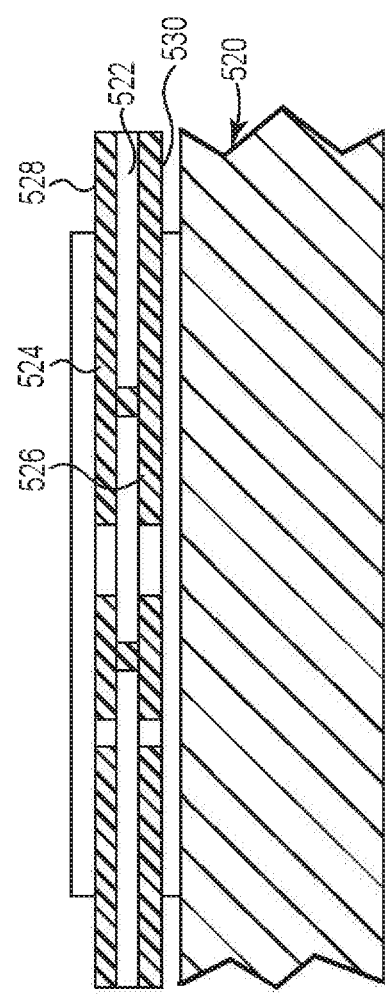
FIG. 25 illustrates an alternate high performance electrical interconnect with printed compliant electrical pads to plug into another connector in accordance with an embodiment of the present disclosure.

FIG. 25 illustrates an alternate high performance electrical interconnect 520 with printed compliant material 522 added between circuit geometries 524, 526 to facilitate insertion of exposed circuit geometries 528, 530 into a receptacle or socket. The compliant material 522 can supplement or replace the compliance in the receptacle or socket. In one embodiment, the compliance is provided by a combination of the compliant material 522 and the exposed circuit geometries 528, 530.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A surface mount electrical interconnect to provide an interface between a PCB and solder balls on a BGA device, the electrical interconnect comprising: a socket substrate comprising a first layer having a plurality of openings configured to receive the solder balls on the BGA device and a second layer having a plurality of slots defined therethrough that correspond to the plurality of openings; and a plurality of electrically conductive contact members disposed in the openings in the first layer and through the plurality of slots of the second layer of the socket substrate, each contact member configured to electrically couple a solder ball on the BGA device to the PCB, wherein each contact member comprises at least three interlocking contact plates that engage with each other in a single opening in the socket substrate and including a semicircular defining a notch with a diameter corresponding to a diameter of the solder balls that simultaneously engages at least a center diameter and a lower portion of the solder balls at a solder ball interface region, the notch configured to be positioned in the opening of the first layer and configured to receive a portion of the solder ball such that a solder ball positioned in the opening is nested within the notch in contact with the contact plate.

2. The electrical interconnect of claim 1, wherein an arc of the semicircular notch extends more than 180 degrees to engage atop portion of the solder ball to retain the solder ball of the BOA device without reflow of the solder ball, and wherein the solder ball of the BGA device is removable from the contact member without reflow of the solder ball.

3. The electrical interconnect of claim 1, wherein each of the plurality of contact members comprises contact tips extending inward toward a middle of the respective opening to score the solder ball and remove oxides during insertion.

4. The electrical interconnect of claim 3, wherein the contact tips on each of the plurality of contact members electrically couple with atop portion of the solder ball when the solder ball is positioned in the respective opening.

5. The electrical interconnect of claim 1, wherein the notch of the contact plate simultaneously engages a top portion, a center diameter and a lower portion of the solder ball of the BGA device.

6. The electrical interconnect of claim 1, comprising at least one contact members comprise a plurality of contact plates with mating notches that engage with each other located in a single opening in the socket substrate.

7. The electrical interconnect of claim 1, wherein the socket substrate further comprises a third layer having a plurality of openings configured to receive solder balls on the PCB, wherein the contact plate includes a lower semicircular notch with a diameter corresponding to a diameter of a solder ball that simultaneously engages at least a center diameter and a lower portion of a solder ball of the PCB.

8. The electrical interconnect of claim 1, further comprising:
   at least one dielectric layer printed on one of a first surface or a second surface of the socket substrate, the dielectric layer comprising a plurality of recesses; and
   a conductive material deposited in at least a portion of the recesses comprising circuit geometry electrically coupling at least two of the plurality of contact members.

9. The electrical interconnect of claim 1, wherein the socket substrate comprises at least one additional circuitry plane selected from one of a ground plane, a power plane, an electrical connection to other circuit members, a dielectric layer, or a flexible circuit.

10. The electrical interconnect of claim 1, further comprising at least one printed electrical device located on the socket substrate and electrically coupled to at least a one of the contact members.

11. An electrical interconnect assembly comprising:
   a housing that retains the electrical interconnect of claim 1;
   a BGA device with solder balls located in the openings in the socket substrate and electrically coupled to the contact tips of the contact members; and
   a PCB soldered to a lower portion of the contact members located at a lower surface of the socket substrate.

12. A surface mount electrical interconnect to provide an interface between a PCB and solder balls on a BGA device, the electrical interconnect comprising: a socket substrate comprising a first layer having a plurality of openings configured to receive the solder balls on the BGA device and a second layer having a plurality of slots defined therethrough that correspond to the plurality of openings; a plurality of electrically conductive contact members disposed in the openings in the first layer and through the plurality of slots of the second layer of the socket substrate, each contact member comprising at least three interlocking contact plates that engage with each other in a single opening in the socket substrate and include a semicircular notch with a diameter corresponding to a diameter of the solder ball that simultaneously engages at least a center diameter and a lower portion of the solder balls at a solder ball interface region such that a solder ball positioned in the opening is nested within the contact member and removable from the contact member and the opening without reflow, and wherein the contact member is configured to electrically couple the solder ball on the BGA device to the PCB.

13. The electrical interconnect of claim 12, wherein each of the plurality of contact members comprises a contact plate including a semicircular notch with a diameter corresponding to a diameter of the solder balls that simultaneously engages at least, a center diameter and a lower portion of the solder balls at a solder ball interface region, the notch configured to be positioned in the opening of the first layer and configured to receive a portion of the solder ball such that the solder ball positioned in the opening is nested within the notch in contact with the contact plate.

14. The electrical interconnect of claim 12, wherein each of the plurality of contact members comprises a pair of contact beams configured to deflect outward during insertion of the solder ball on the BGA device into the respective opening and retract inward to engage the solder ball, wherein the openings in the first layer are configured to permit outward deflection of the contact beams and limit over deflection of the contact beams.

15. A method of making a surface mount electrical interconnect to provide an interface between a PCB and solder balls on a BGA device, the method comprising: forming a socket substrate with a first layer having a plurality of openings configured to receive the solder balls on the BGA device and a second layer having a plurality of slots defined therethrough that correspond to the plurality of openings; inserting a plurality of electrically conductive contact members within the openings in the first layer and through the plurality of slots of the second layer of the socket substrate, each contact member comprises at least three interlocking contact plates that engage with each other in a single opening in the socket substrate and including a semicircular notch with a diameter corresponding to a diameter of the solder balls that simultaneously engages at least a center diameter and a lower portion of the solder balls, the notch configured to receive and retain a portion of a solder ball of the BOA device such that a solder ball positioned in the opening is nested within the contact member and removable from the contact member and the opening without reflow, and wherein the contact member is configured to electrically couple the solder ball on the BOA device to the PCB.

16. The method of claim 15, further comprising:
   forming each contact member of one or more contact plates each having a notch, at a solder ball interface region, the notch configured to be positioned in the opening of the first layer and configured to receive a portion of the solder ball such that the solder ball positioned in the opening is nested within the notch in contact with the contact plate.

17. The method of claim 15, further comprising:
   forming the contact members with a pair of opposing contact beams configured to deflect outward during insertion of the solder ball on the BGA device into the respective opening and to retract inward to engage the solder ball, wherein the openings in the first layer are configured to permit outward deflection of the contact beams and limit over deflection of the contact beams.

18. The method of claim 15, wherein inserting the plurality of contact members includes inserting contact beams of each contact member from a bottom surface of the socket substrate through slots in the second layer and into the openings, wherein a contact base of each contact member remains disposed outside the opening in abutment with the second layer.

19. The method of claim 15, further comprising configuring the plurality of contact members to simultaneously engage a top portion, a center diameter and a lower portion of the solder balls on the BOA device.

20. The method of claim 15, further comprising:
   printing at least one dielectric layer on one of a first surface or a second surface of the socket substrate, including printing the dielectric layer to have a plurality of recesses; and
   printing a conductive material in at least a portion of the recesses comprising circuit geometry electrically coupling at least two of the contact members.

* * * * *